(12) United States Patent
Kasuga et al.

(10) Patent No.: US 6,870,401 B1
(45) Date of Patent: Mar. 22, 2005

(54) SIGNAL TRANSMISSION CIRCUIT

(75) Inventors: Shigetaka Kasuga, Hirakata (JP);
Takumi Yamaguchi, Kyoto (JP);
Takahiko Murata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/902,095

(22) Filed: Jul. 30, 2004

(30) Foreign Application Priority Data

Aug. 29, 2003 (JP) .......................................... 2003-307744
Aug. 29, 2003 (JP) .......................................... 2003-307745
Aug. 29, 2003 (JP) .......................................... 2003-307746

(51) Int. Cl.$^7$ ............................................ H03K 19/094
(52) U.S. Cl. ........................... 326/88; 326/83; 326/86
(58) Field of Search .............................. 326/82, 83, 86, 326/87, 88, 89, 90, 92

(56) References Cited

U.S. PATENT DOCUMENTS

| | | | | |
|---|---|---|---|---|
| 4,149,232 A | * | 4/1979 | Eaton, Jr. ..................... | 363/60 |
| 5,517,543 A | * | 5/1996 | Schleupen et al. ............ | 377/79 |
| 5,650,671 A | * | 7/1997 | Pascucci et al. .............. | 307/110 |
| 5,949,271 A | * | 9/1999 | Fujikura ....................... | 327/390 |
| 5,973,514 A | * | 10/1999 | Kuo et al. ..................... | 326/98 |

FOREIGN PATENT DOCUMENTS

JP          3-75960          12/1991

\* cited by examiner

Primary Examiner—Don Le
(74) Attorney, Agent, or Firm—Wenderoth, Lind & Ponack, L.L.P.

(57) ABSTRACT

The signal transmission circuit is provided, said signal transmission circuit being capable of stable operations even with a source power of low voltage and a fast operation. The signal transmission circuit comprises plural stages of circuit in each of which the pulse voltage according to the driving pulse is sequentially outputted. The circuit of each stage includes: the output transistor T12 for outputting the pulse voltage to the source, according to the driving pulse; the bootstrap capacitor C1 connected between the gate and the source of the output transistor; the first charging transistor T11 for charging the bootstrap capacitor; the first and the second discharging transistor T13 and T14 for discharging the electric charge of the bootstrap capacitor; and the logical circuit which (i) turns on the first and the second discharging transistor, according to the driving pulse for each circuit of the other stages, and (ii) turns off the first and the second discharging transistor, according to the gate signal of the charging transistor.

27 Claims, 16 Drawing Sheets

SIGNAL TRANSMISSION CIRCUIT

BACKGROUND OF THE INVENTION (1) Field of the Invention

The present invention relates to a signal transmission circuit, so-called shift register, in particular, to the shift register for driving Liquid Crystal Display (LCD) and Metal Oxide Semiconductor (MOS) image sensor.

(2) Description of the Related Art

FIG. 1 is a circuit diagram showing a structure example of a conventional signal transmission circuit, and describes the four stages of the circuit comprising multiple stages (refer to Japanese Patent publication No. H3-75960 (FIG. 3)). This signal transmission circuit comprises the output transistor to the next stage T12, T22, T32 and T42, the bootstrap capacitor C1, C2, C3 and C4, the bootstrap capacitor charging transistor T11, T21, T31 and T41, the first discharging transistor T13, T23, T33 and T43 and the second discharging transistor T14, T24, T34 and T44.

Each element of this signal transmission circuit is provided with, at least, one or more than one of the source voltage VDD, the driving pulses V1 and V2 and the start pulse VST.

The operations performed by the conventional signal transmission circuit of such structure as described above will be explained as following. When the start pulse VST rises to the logical "High" level, the bootstrap capacitor charging transistor T11 of the first stage turns on. Thus, the electric charge is charged in the bootstrap capacitor C1 until the electric voltage becomes (the source voltage VDD—the threshold voltage Vt1 of the transistor T 11).

When the charging voltage of the bootstrap capacitor C1 exceeds the threshold voltage of the output transistor T12, the output transistor T12 of the first stage turns on. Then, after the driving pulse V1 of the logical "High" level is inputted into the drain of the output transistor T12, the voltage of the driving pulse V1 and the potential difference between the both ends of the bootstrap capacitor C1 are added and applied to the gate of the output transistor T12. When the gate potential (the node N11) of the output transistor T12 rises higher than the potential of the driving pulse V1, the driving pulse V1 gets outputted as the output pulse OUT1 from the node N12.

At the same time, when (i) the voltage of the node N12 is applied to the gate of the bootstrap capacitor charging transistor T21 of the second stage, (ii) the transistor T21 turns on, and (iii) the bootstrap capacitor C2 is charged to the source voltage VDD while the charging voltage does not fall for the threshold voltage Vt2 of the transistor T21.

When the charging voltage of the bootstrap capacitor C2 exceeds the threshold voltage of the output transistor T22, the output transistor T22 of the second stage turns on. Then, after the driving pulse V2 of the logical "High" level is inputted into the drain of the output transistor T22, the potential of the driving pulse V2 and the potential difference between the both ends of the bootstrap capacitor C2 are added and applied to the gate of the output transistor. When the gate voltage (the node N21) of the transistor T22 rises higher than the potential of the driving pulse V2, the driving pulse V2 is outputted as the output pulse OUT2 from the node N22.

At the same time, when the voltage of the node N22 is applied to the gate of the bootstrap capacitor charging transistor T31 of the third stage, the transistor T31 turns on. Thus, the bootstrap capacitor C3 is charged to the source voltage VDD without falling for the threshold voltage Vt3 of the transistor T32.

When the charging voltage of the bootstrap capacitor C3 exceeds the threshold voltage of the output transistor T32, the output transistor T32 of the third stage turns on.

Such operations as described above are repeated, and the signal transmission circuit further sequentially outputs the output pulse Out3 and Out4.

FIG. 2 is a circuit diagram showing a structure example of a conventional error operation preventative signal transmission circuit. In this improved signal transmission circuit, the source voltage is certainly applied to the gate of the bootstrap capacitor charging transistor, while in the conventional signal transmission circuit shown in FIG. 1, only the lower voltage than the source voltage VDD was applied to the gate of the bootstrap capacitor charging transistor. This error operation preventative signal transmission circuit prevents (i) the voltages of the nodes N11, N21, N31 and N41 from gradually falling and (ii) the output pulses from stopping at several stages forward.

The error operation preventative signal transmission circuit shown in FIG. 2 is different from the signal transmission circuit shown in FIG. 1, and it further comprises the first error operation preventative transistor T35 and T45, respectively for the circuit of the third and the fourth stages. As for the transistor T35, (i) the gate is connected to the source (the node N12) of the output transistor T12, (ii) the drain is connected to the source (the node N31) of the bootstrap capacitor charging transistor T31, and (iii) the source is earthed. As for the transistor T45, (i) the gate is connected to the source (the node N22) of the output transistor T22, (ii) the drain is connected to the source (the node N41) of the bootstrap capacitor charging transistor T41, and (iii) the source is earthed.

In addition, the error operation preventative signal transmission circuit shown in FIG. 2 is different from the signal transmission circuit shown in FIG. 1 in that the gate of the second discharging transistor of each stage is connected to the source of the output transistor of the next stage. For example, the gate of the second discharging transistor T14 of the first stage is connected to the source of the output transistor T22 of the second stage.

The operations performed by the error operation preventative signal transmission circuit will be explained as following.

FIG. 3 is a time chart showing the pulse voltage of each unit in the conventional signal transmission circuit using only NMOS. This circuit is a 3V type circuit, wherein the voltage amplitude of the driving; pulses V1 and V2 and the source voltage VDD are 3V.

However, the voltage amplitude of the start pulse VST is 5V. Here, the reason why only the source voltage of the start pulse VST is 5V is because only in the bootstrap capacitor charging transistor T11 of the first stage where the start pulse VST is inputted, the high voltage from the previous stage cannot be provided. Therefore, only the start pulse VST drives the transistor T11 with the voltage amplitude of 5V which is higher than 3V of the driving pulses V1 and V2; prevents the voltage from falling in the transistor T11; and enables the bootstrap capacitor C1 to charge up to 3V of the source voltage VDD.

In FIG. 3 at the time T0, when the start pulse VST rises to 5V, the bootstrap capacitor charging transistor T11 of the first stage turns on; and the bootstrap capacitor C1 is charged toward the source voltage VDD. Here, even if the bootstrap capacitor charging transistor T11 is an enhancement type NMOS, without the influence of the threshold voltage Vt1 of the transistor T11, the voltage VN11 of the node N11 where the gate of the output transistor T12 is connected is charged up to 3V of the source voltage VDD; and the output transistor T12 turns on.

At the time T1, when the driving pulse V1 of 3V is inputted into the drain of the output transistor T12, the voltage HB1 is applied to the gate (the node N11) of the output transistor T12, said voltage HB1 being the combination of the driving pulse V1 of 3V and the potential difference between the both ends of the bootstrap capacitor C1 (3V−Vt1); and the pulse of the amplitude H1 is outputted from the node N12.

At the same time, the voltage HB1 of the node N11 is applied to the gate of the bootstrap capacitor charging transistor T21 of the second stage; the transistor T21 turns on; and the bootstrap capacitor C2 is charged to the source voltage VDD without falling for the threshold voltage of the transistor T21. When the charging voltage of the bootstrap capacitor C2 (the node N21) exceeds the threshold voltage of the output transistor T22, the output transistor T22 of the second stage turns on.

Simultaneously, the voltage of the node N21 is applied to the gate of, the bootstrap capacitor charging transistor T31 of the third stage. Thus, the transistor T31 turns on, and the bootstrap capacitor C3 is charged to the voltage(3V−Vt3) lowered for the threshold voltage Vt3 of the transistor T31. In this state, in the case the driving pulse V1 is 3V which is a logical "High" level, when the driving pulse V1 is outputted to the output node N12 of the first stage, the pulse of the amplitude less than the driving pulse of V1 is also outputted to the output node N32 of the third stage. To solve this problem, the plus terminal of the bootstrap capacitor C3 is set close to the earth voltage; and in order for the output transistor T32 of the third stage to turn off, the error operation preventative transistor T35 is connected between the plus terminal of the bootstrap capacitor C3 and the earth voltage. In other words, the drain of the error operation preventative transistor T35 is connected to the plus terminal of the bootstrap capacitor C3; the source of T35 is connected to the earth voltage; and the gate is connected to the output node N12 of the first stage. Also, when the driving pulse V1 is appearing in the output node N12 of the first stage, the error operation preventative transistor T35 is turned on; the potential of the node N31 is set close to the earth voltage; thereby the driving pulse V1 is prevented from appearing in the output node N32 of the third stage.

In the same manner, the plus terminal of the bootstrap capacitor C4 is connected to the drain of the error operation preventative transistor T45; the earth voltage is connected to the source of the T45; the gate of T45 is connected to the output node N22 of the two stages forward; thus, the error operation is prevented through all the stages.

However, in the processes of a low-voltage driving and a fast operation, it is necessary to set the threshold voltage low for the output transistor such as the output transistor T32. In the error operation preventative method wherein only the plus terminal of the bootstrap capacitor C3 is set close to the earth voltage, the output transistor such as the output transistor T32 turns on; and the voltage with the amplitude lower than V1 and V2 of the driving pulse is outputted to the node N32 and all the nodes of the backward stages corresponding to the node N32. Therefore, the pulse output occurs in other places than the designated places for the pulse output, and the signal transmission circuit does not operate normally.

For example, at the time T1, the error operation preventative transistor T35 has "ON" electrical resistance; the potential of the node N31 does not completely become 0; thus the output transistor T32 turns on.

In the future processes of the low-voltage driving and the fast operation of the circuit, this error operation will appear prominently.

SUMMARY OF THE INVENTION

An object of the present invention, in view of the above problem, is to provide a signal transmission circuit which is capable of a stable operation even in the case where (a) a circuit is connected with a source power of low voltage and (b) a circuit is operated by fast driving.

In order to achieve such object as described above, the signal transmission circuit according to the present invention comprises plural stages of circuit in each of which a pulse voltage according to a driving pulse is sequentially outputted, the circuit of each stage including: an output transistor which outputs the pulse voltage to a source, according to the driving pulse; a bootstrap capacitor connected between a gate of the output transistor and the source; a first charging transistor whose drain is connected to a power source or an earth line and whose source is connected to the gate of the output transistor in order to charge the bootstrap capacitor, wherein in the case where a first discharging transistor is in the first stage, a start pulse is provided to the gate of the first discharging transistor, and in the case where a first discharging transistor is in the second stage or backward, the gate of the first discharging transistor is connected to the gate of the output transistor; a first discharging transistor whose drain is connected to one end of the bootstrap capacitor; a second discharging transistor whose drain is connected to the other end of the bootstrap capacitor; and an output transistor control circuit which prevents the pulse voltage from outputting from the output transistor of each circuit of the other stages, in the case the pulse voltage is outputted from the source of the output transistor.

It is desirable that the output transistor control circuit is a logical circuit which (i) turns on the first and second discharging transistors, according to the driving pulse for each circuit of the other stages, and (ii) turns off the first and second discharging transistors, according to the gate signal of the charging transistor.

The first and second discharging transistors are turned on, according to a driving pulse for each circuit of the other stages. Therefore, in the case where a pulse voltage is not outputted from each circuit of the corresponding stage, it is possible to certainly earth the source of the output transistor. On the other hand, in the case where a pulse voltage is outputted from each circuit of the corresponding stage, the first and second discharging transistors are turned off. Thus, a pulse voltage can be outputted from the source of the output transistor.

Also, the gate of the first discharging transistor is further connected to the source of the output transistor of the next stage; the gate of the second discharging transistor is connected to the source of the output transistor of the next stage; the output transistor control circuit has: a first error operation preventative transistor whose drain is connected to the gate of the output transistor, and whose gate is connected to the source of the output transistor of the two stages forward, and a second error operation preventative transistor whose drain is connected to the source of the output transistor, and whose gate is connected to the source of the output transistor of two stages forward.

According to such structure as described above, even in the case where a pulse voltage is outputted to the source of the output transistor of the third stage and backward by error operation, the output pulse of the two stages forward is applied to the gate of the second error operation preventative transistor. Thus, the second error operation preventative transistor is on. Therefore, it is possible to earth the potential of the output pulse of the third stage and backward; thereby it is possible to prevent the pulse voltage from being caused by error operation of the source of the output transistor of the third stage and backward.

It is desirable that the circuit of each stage includes a third error operation preventative transistor whose drain is connected to the source of the output transistor, and whose gate is connected to the source of the output transistor of the two stages backward.

According to such structure as described above, even in the case where a pulse voltage is outputted to the source of the output transistor of the circuit of the two stages forward by error operation, a pulse voltage of the output pulse is applied to the gate of the third error operation preventative transistor of the two stages forward. Thus, the third error operation preventative transistor is on. Therefore, it is possible to earth the pulse voltage of two stages forward.

Moreover, as for the first discharging transistor, the pulse voltage is applied to the gate, said pulse voltage being provided from the source of the output transistor of the next stage; as for the second discharging transistor, the pulse voltage is applied to the gate, said pulse voltage being provided from the source of the output transistor of the next stage; and the output transistor control circuit is a logical circuit which (i) outputs the voltage signal of "High" level in the case the source voltage of the output transistor is "High" level, and (ii) outputs the voltage signal of "Low" level, according to the gate voltage of the output transistor, in the case the source voltage of the output transistor is "Low" level.

Because the logical circuit is formed as described above, only in the circuit of the stage where the original pulse output is caused, the pulse is outputted to the OUT terminal as usual; and in the circuit of the other stages, even if the pulse output is caused by error operation, the pulse is stopped by the switch circuit before being outputted to the OUT terminal. Thus, from the viewpoint of the OUT terminal of the signal transmission circuit, the pulse is normally scanned, and the surrounding circuit does not receive any bad influence. In other words, it is possible to provide a signal transmission circuit which can normally output a pulse to the external OUT terminal even if an error operation occurs inside the signal transmission circuit.

According to the present invention, a pulse voltage is outputted only in the circuit of the desirable stage, and it is not outputted in the circuit of the other stages. Therefore, it is possible to stably drive the signal transmission circuit even in the low-source voltage circuit and fast driving. It is expected to show beneficial effects, in particular, if applied to an MOS solid image sensor and an LCD apparatus. Consequently, the present invention is considered extremely profitable.

FURTHER INFORMATION ABOUT TECHNICAL BACKGROUND TO THIS APPLICATION

The disclosure of Japanese Patent Applications No. 2003-307744 filed on Aug. 29, 2003, No. 2003-307745 filed on Aug. 29, 2003 and No. 2003-307746 filed on Aug. 29, 2003, each including specification, drawings and claims are incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

(First Embodiment)

Figure 4:
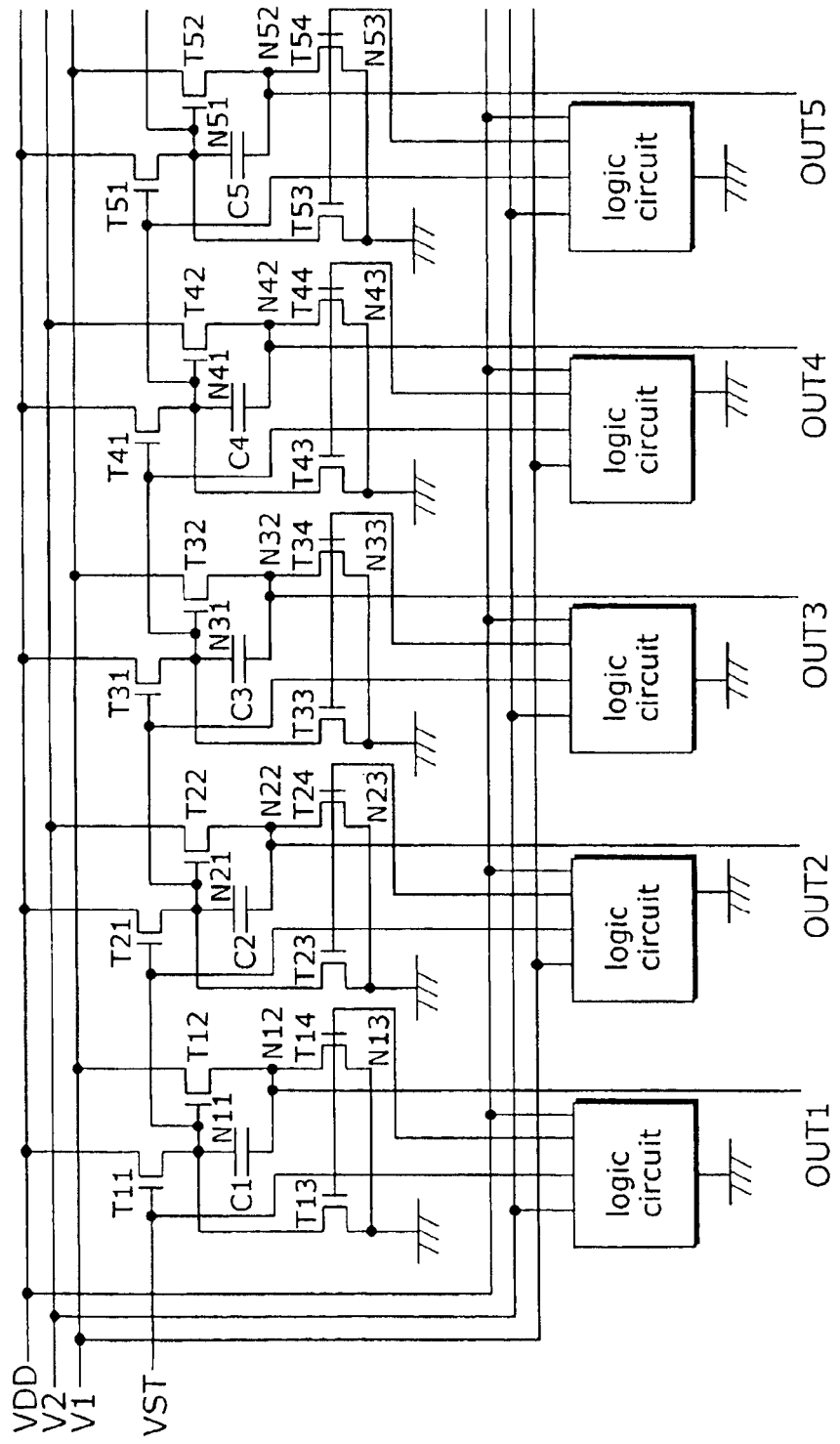
FIG. 4 is a circuit diagram of the error operation preventative signal transmission circuit according to the first embodiment of the present invention.

FIG. 4 is a schematic diagram of the signal transmission circuit according to the first embodiment of the present invention.

Figure 1:
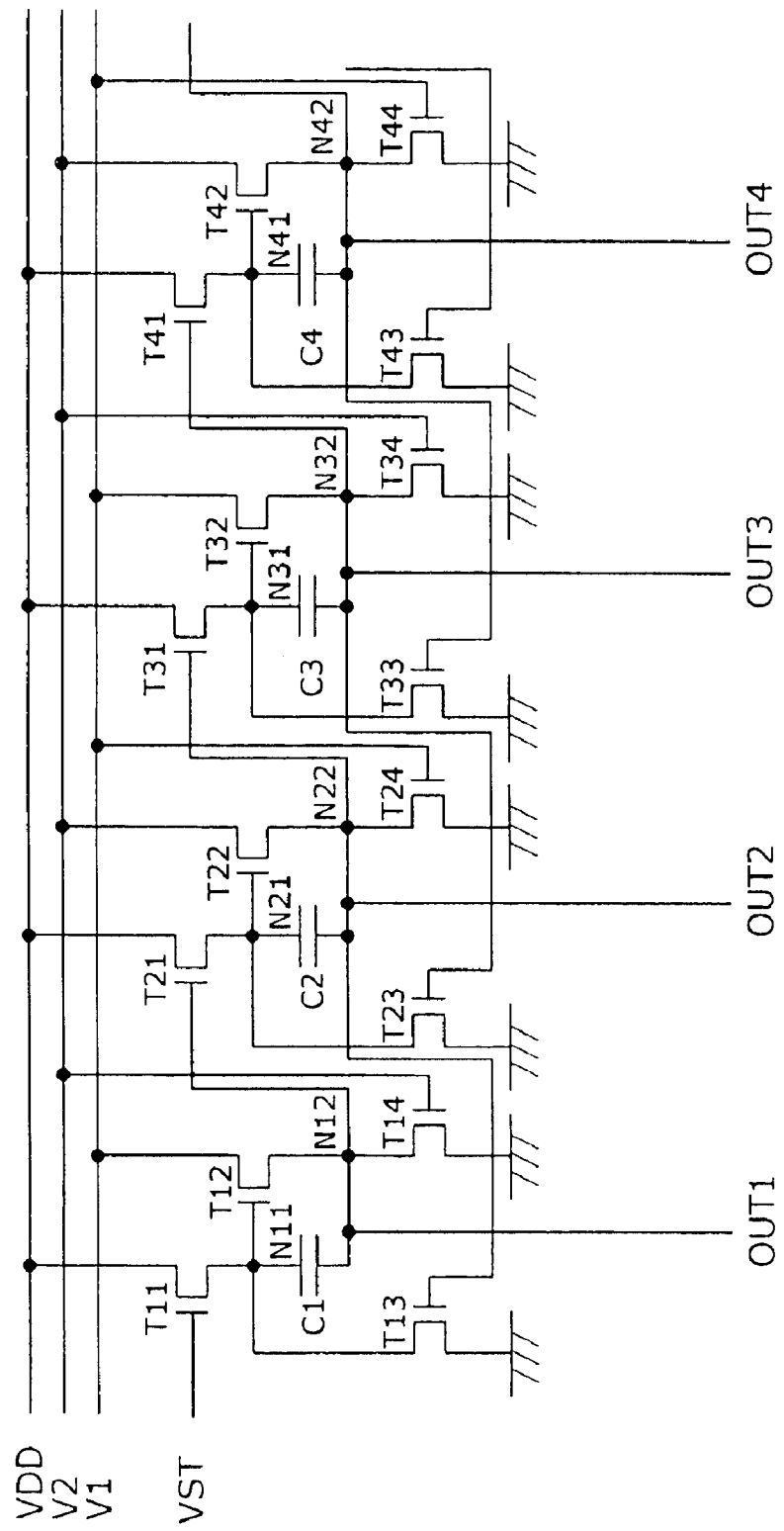
FIG. 1 is a circuit diagram of the conventional signal transmission circuit.
Figure 2:
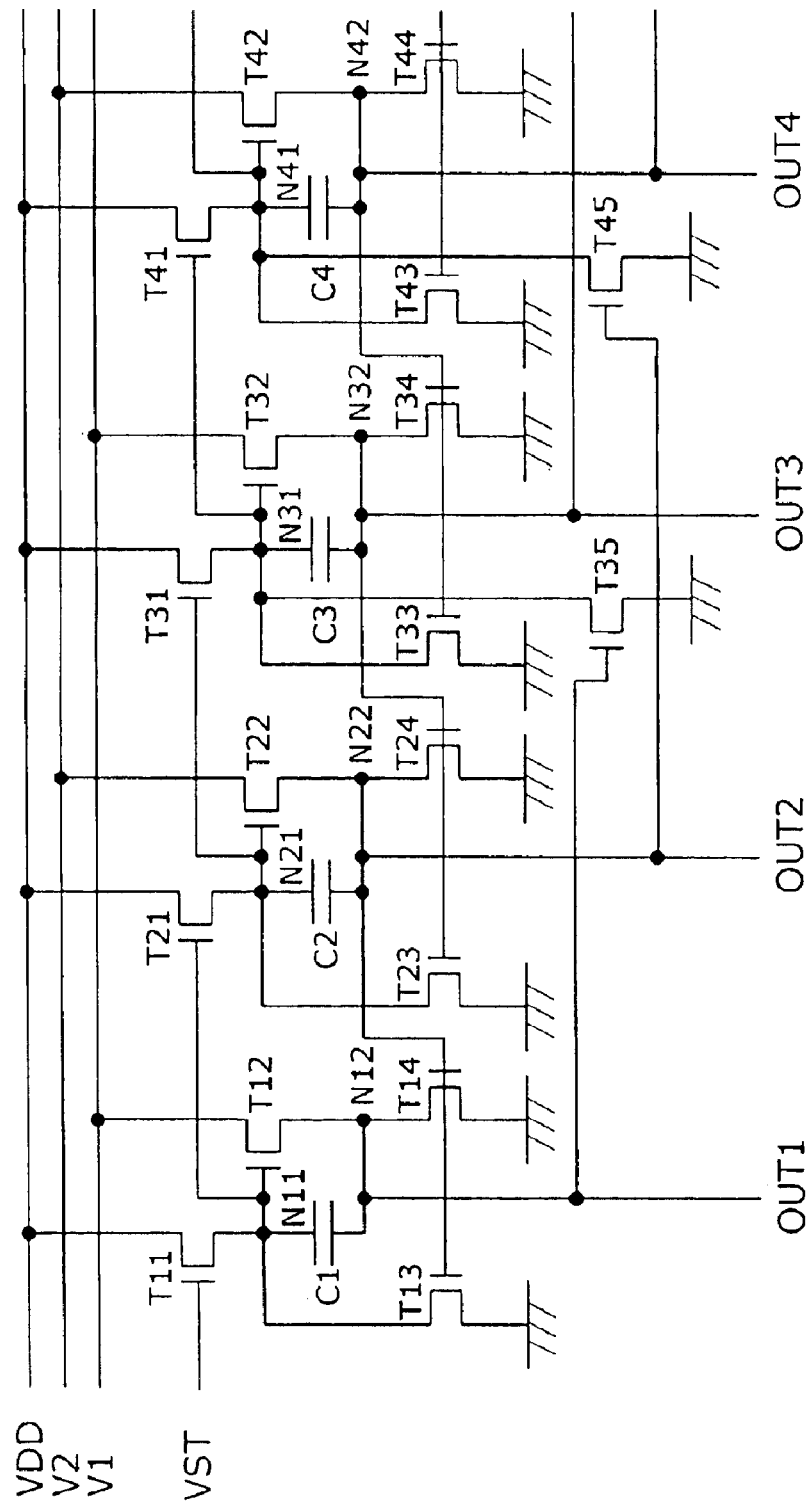
FIG. 2 is a circuit diagram of the conventional error operation preventative signal transmission circuit.
Figure 3:
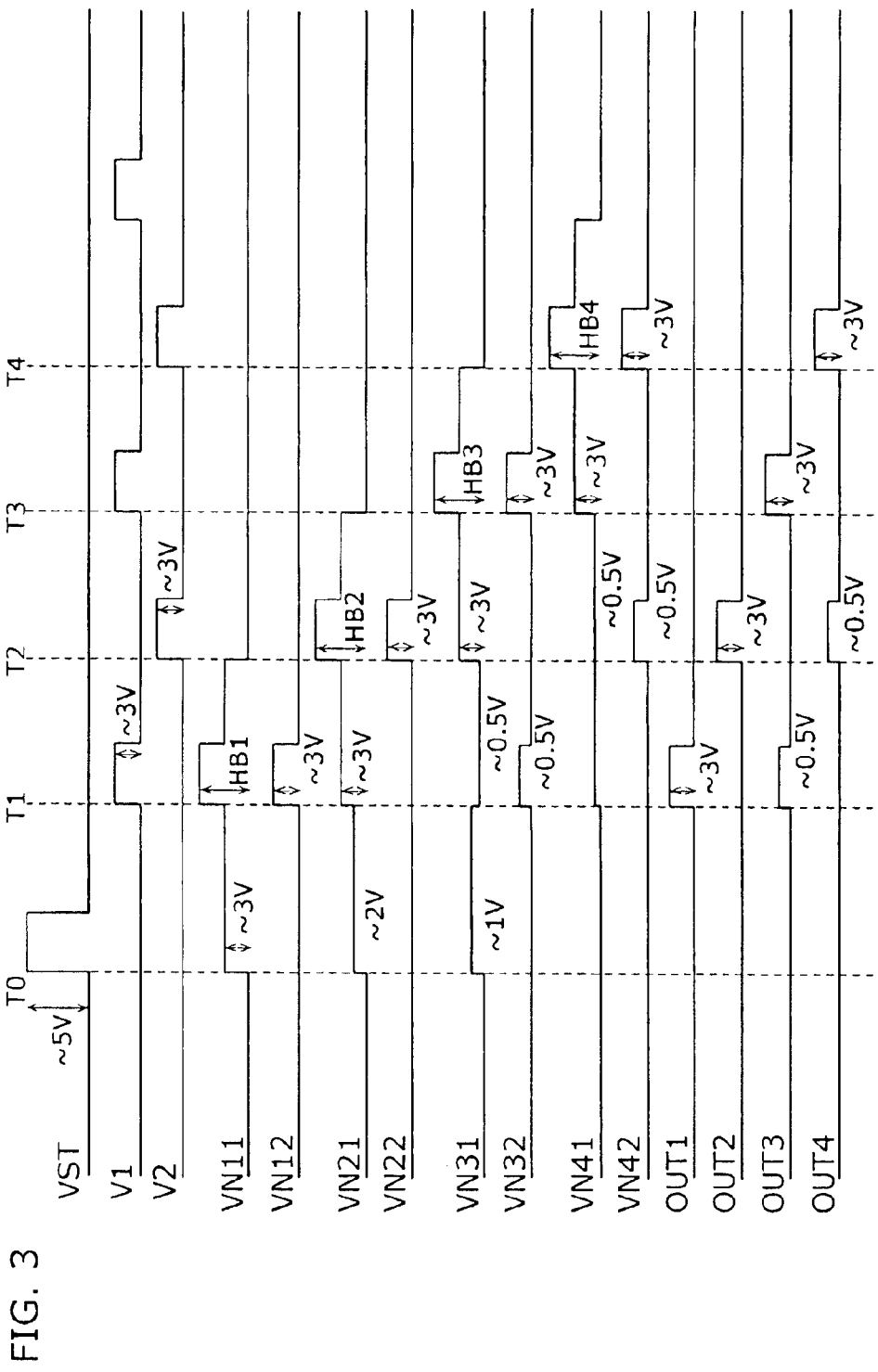
FIG. 3 is an operational time chart of the conventional error operation preventative signal transmission circuit.

The signal transmission circuit according to the first embodiment comprises plural stages of circuit in which each pulse voltage following the driving pulse is sequentially outputted from the circuit of each stage. Here, five stages of circuit are shown. The signal transmission circuit according to the present embodiment is different from the conventional signal transmission circuit as shown in FIG. 1 in that each stage includes a logical circuit. Also, the gates of the first discharging transistor and the second discharging transistor are connected to the logical circuit.

The logical circuit of the "2N−1"th (N is a natural number) stages (i)turn on the first discharging transistor T13 (T33, T53) and the second discharging transistor T14 (T34, T54), according to the driving pulse V2 for the circuit of the "2N"th stages (N is a natural number), and (ii) turn off the first discharging transistor T13 (T33, T53) and the second discharging transistor T14 (T34, T54), according to the gate signal of the bootstrap capacitor charging transistor T11 (T31, T51).

The logical circuit of the "2N"th stages (i) turn on the first discharging transistor T23 (T43) and the second discharging transistor T24 (T44), according to the driving pulse V1 for the circuit of the "2N−1"th stages and (ii) turn off the first discharging transistor T23 (T43) and the second discharging transistor T24 (T44), according to the gate signal of the bootstrap capacitor charging transistor T21 (T41).

According to this structure, only in the circuit of the stages wherein the proper pulse output occurs, the pulse is outputted to the OUT terminal as usual; and in the circuit of the other stages, the pulse output due to error operation does not occur.

Figure 5:
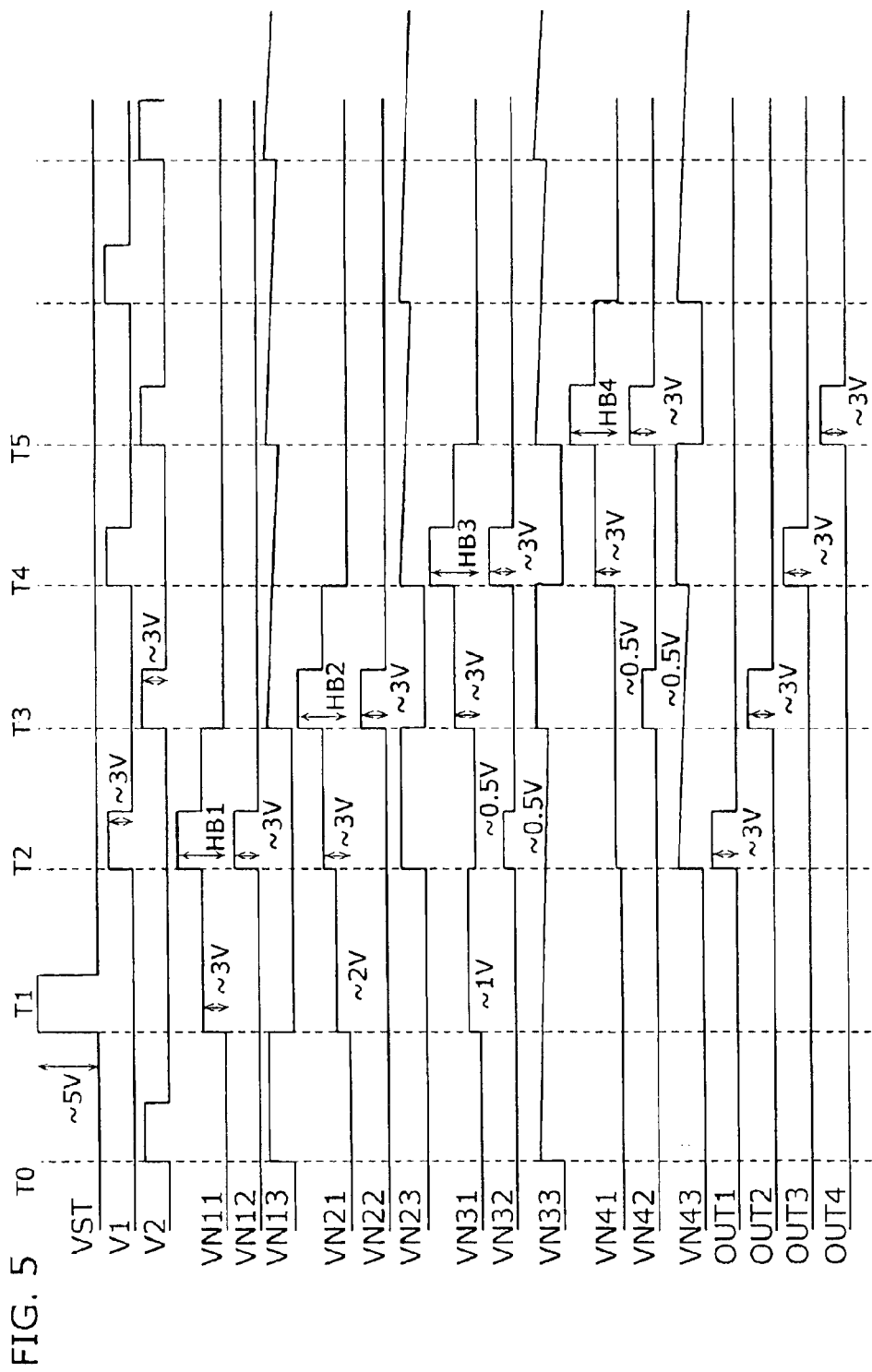
FIG. 5 is an operational time chart according to the first embodiment of the present invention.

Further operations will be explained, referring to FIG. 5. FIG. 5 is an operational time chart showing the pulse voltage of each unit in the signal transmission circuit according to the first embodiment of the present invention. This circuit is a 3V type circuit, wherein the voltage amplitude of the driving pulses V1 and V2 and the source voltage VDD are 3V. However, the voltage amplitude of the start pulse VST is 5V. Here, the reason why only the voltage amplitude of the start pulse VST is 5V is because only in the bootstrap capacitor charging transistor T11 of the first stage where the start pulse VST is inputted, the high voltage from the previous stage cannot be provided. Therefore, only the start pulse VST drives the transistor T11 with the voltage amplitude of 5V which is higher than 3V of the driving pulses V1 and V2; prevents the voltage from falling in the transistor T11; and enables the bootstrap capacitor C1 to charge up to 3V of the source voltage VDD.

In FIG. 5 at the time T1, when the start pulse VST rises to 5V, the bootstrap capacitor charging transistor T11 of the first stage turns on; and the bootstrap capacitor C1 is charged toward the source voltage VDD. Here, even if the bootstrap capacitor charging transistor T11 is an enhancement type NMOS, without the influence of the threshold voltage Vt1 of the transistor T11, the voltage VN11 of the node N11 where the gate of the output transistor T12 is connected is charged up to 3V of the source voltage VDD; and the output transistor T12 turns on.

At the time T2, when the driving pulse V1 of 3V is inputted into the drain of the output transistor T12, the high voltage HB1 is applied to the gate (the node N11) of the output transistor T12, said high voltage HB1 being the addition of the driving pulse V1 of 3V and the potential difference of 3V between the both ends of the bootstrap capacitor C1; and the driving pulse V1 of the amplitude 3V is certainly outputted as the output pulse OUT1 from the node N12. At the same time, the voltage HB1 of the node N11 is applied to the gate of the bootstrap capacitor charging transistor T21 of the second stage; the transistor T21 turns on; and the bootstrap capacitor C2 is charged to the source voltage VDD without falling for the threshold voltage of the transistor T21. When the charging voltage of the bootstrap capacitor C2 (the node N21) exceeds the threshold voltage of the output transistor T22, the output transistor T22 of the second stage turns on. Simultaneously, the voltage of the node N21 is applied to the gate of the bootstrap capacitor charging transistor T31 of the third stage. Thus, the transistor T31 turns on, and the bootstrap capacitor C3 is charged to the voltage(3V−Vt3) lowered for the threshold voltage Vt3 of the transistor T31. In this state, in the case the driving pulse V1 is 3V which is a logical "High" level, when the driving pulse V1 is outputted to the output node N12 of the first stage, the pulse of the amplitude less than the driving pulse of V1 is also outputted to the output node N32 of the third stage. Even in such case as described above, in the present embodiment, only the driving pulse V1 of the output node N12 of the first stage is outputted to the OUT1 terminal; thereby the pulse of the amplitude lower than the driving pulse V1 which occurred in the output node N32 of the third stage does not occur to the OUT3 terminal.

In other words, at the time T0, in the driving pulse V2, the potential of the logical circuit internal node N13, the node N33 and the node N53 is charged to "High". Then, the first discharging transistor and the second discharging transistor turn on. After that, every time the driving pulse V2 becomes "High", the charging is repeated; the output node N12, the node N32, and the node N53 are earthed; thus the pulse output does not appear in the OUT terminal. However, at the time T1, when the start pulse VST becomes "High", the potential of the logical circuit internal node N13 of the first stage is discharged to "Low"; thereby the first discharging transistor and the second discharging transistor turn off. At the time T2, when the driving pulse V1 becomes "High", the output node N12 is not earthed; thereby the pulse output appears in the OUT terminal. At the time T3, again, in the driving pulse V2, the potential of the logical circuit internal node N13 is charged to "High". After that, every time the driving pulse V2 becomes "High", the charging is repeated; thereby the output node N12 remains earthed. Simultaneously, in the logical circuit internal node N33 and the node N53, every time the driving pulse V2 becomes "High", the charging is repeated; thus the output nodes N32 and N52 remain earthed. At the time T4, when the driving pulse V1 becomes "High", the potential of the logical circuit internal node N33 of the third stage is discharged to "Low"; the first discharging transistor and the second discharging transistor turn off; the output node N32 is not earthed; and the pulse output appears in the OUT terminal.

At the time T5, again, in the driving pulse V2, the potential of the logical circuit internal node N33 is charged to "High". After that, every time the driving pulse V2 becomes "High", the charging is repeated; thereby the output node N32 remains earthed. The output node N53 and the like repeat the same operations as described above. As for the circuit of the "2N"th stages such as the output node N22 and the node N42, every time the driving pulse V1 becomes "High", the logical circuit internal node N23 and N43 are charged; thereby the output nodes remain earthed. However, only at the times when the first charging transistor of the circuit of each stage turns on, the logical circuit internal nodes N23, N43 and the like are discharged; and the pulse output appears in each OUT terminal. As described above, only when the first charging transistor of the circuit of each stage is on, the pulse is outputted from the output node of the circuit of each stage; at other times, the pulse output does not appear.

Consequently, it is possible to provide a signal transmission circuit capable of a stable operation even with a circuit source power of low voltage and a fast driving.

(Second Embodiment)

Figure 6:
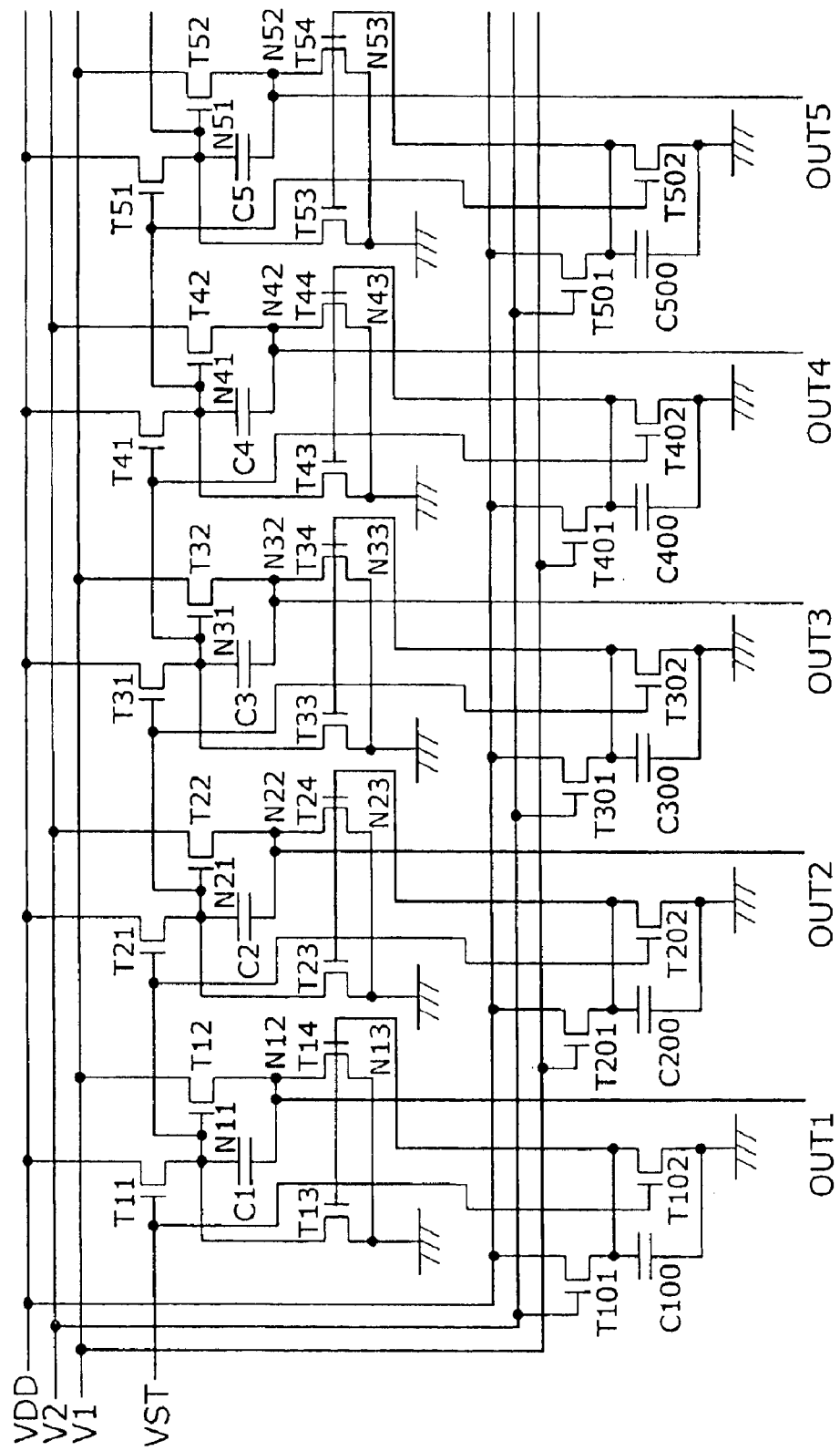
FIG. 6 is a circuit diagram of the error operation preventative signal transmission circuit according to the second embodiment of the present invention.

FIG. 6 is a structure example of the signal transmission circuit according to the second embodiment of the present invention. The signal transmission circuit according to the second embodiment shows the logical circuit units of the first embodiment in further detail.

The logical circuit of the "2N−1"th stages include the voltage holding capacitor C100 (C300, C500), the second charging transistor T101 (T301, T501) and the third discharging transistor T102 (T302, T502). The second charging transistor T101 (T301, T501) connects: each drain and each source: each gate and the driving pulse V2 for each circuit of "2N"th stages: and each source and the voltage holding capacitor C100 (C300, C500). The third discharging transistor connects: each drain and each source of the second charging transistor T101 (T301, T501): each gate and each gate of the bootstrap capacitor charging transistor T11 (T31, T51): and each source and the earth line.

The logical circuit of the "2N"th stages include the voltage holding capacitor C200 (C400), the second charging transistor T201 (T401) and the third discharging transistor T202 (T402). The second charging transistor T201 (T401) connects: each drain and each source: each gate and the driving pulse V1 for each circuit of "2N−1"th stages: and each source and the voltage holding capacitor C200 (C400). The third discharging transistor connects: each drain and each source of the second charging transistor T201 (T401): each gate and each gate of the bootstrap capacitor charging transistor T21 (T41): and each source and the earth line.

In both the circuit of the "2N"th stages and the circuit of the "2N−1"th stages, in the voltage holding capacitor C100–C500 included in The logical circuit, one end of each electrodes is connected to each source of the second charging transistor T101–T501 and each drain of the third discharging transistor T102–T502; the other end of each electrode is connected to the earth line; and the sources of the second charging transistor T101–T501 and the drains of the third discharging transistor T102–T502 are connected to the gates of the first discharging transistor T13–T53 and the second discharging transistor T101–T501.

The operations of such signal transmission circuit as described above will be explained as following.

In the first stage, in the second charging transistor T101, when the driving pulse V2 becomes "High", the voltage holding capacitor C100 starts charging; the first discharging transistor T13 and the second discharging transistor T14 turn on; and the output node N12 is earthed. When the start pulse VST becomes "High", the voltage holding capacitor C100 starts discharging; the first discharging transistor T13 and the second discharging transistor T14 turn off; and the potential of the output node N12 is outputted to the OUT terminal. As for the circuit of the "2N−1"th stages, when the driving pulse V2 becomes "High", the voltage holding capacitor starts charging; the first discharging transistor and the second discharging transistor turn on; and the output node is earthed. When the gate of the first charging transistor becomes "High", the voltage holding capacitor starts discharging; the first discharging transistor and the second discharging transistor turn off; and the potential of the output node is outputted to the OUT terminal.

As for the circuit of the "2N"th stages, when the driving pulse V1 becomes "High", the voltage holding capacitor starts charging; the first discharging transistor and the second discharging transistor turn on; and the output node is earthed. When the gate of the first charging transistor becomes "High", the voltage holding capacitor starts discharging; the first discharging transistor and the second discharging transistor turn off; and the potential of the output node is outputted to the OUT terminal.

As described above, according to the present embodiment, only when the first charging transistor of the circuit of each stage is on, the pulse is outputted from the output node of the circuit of each stage; at other times, the pulse output does not appear.

Consequently, it is possible to provide the signal transmission circuit capable of the stable operation in the state of the low voltage of the circuit source and the fast driving.

(Third Embodiment)

Figure 7:
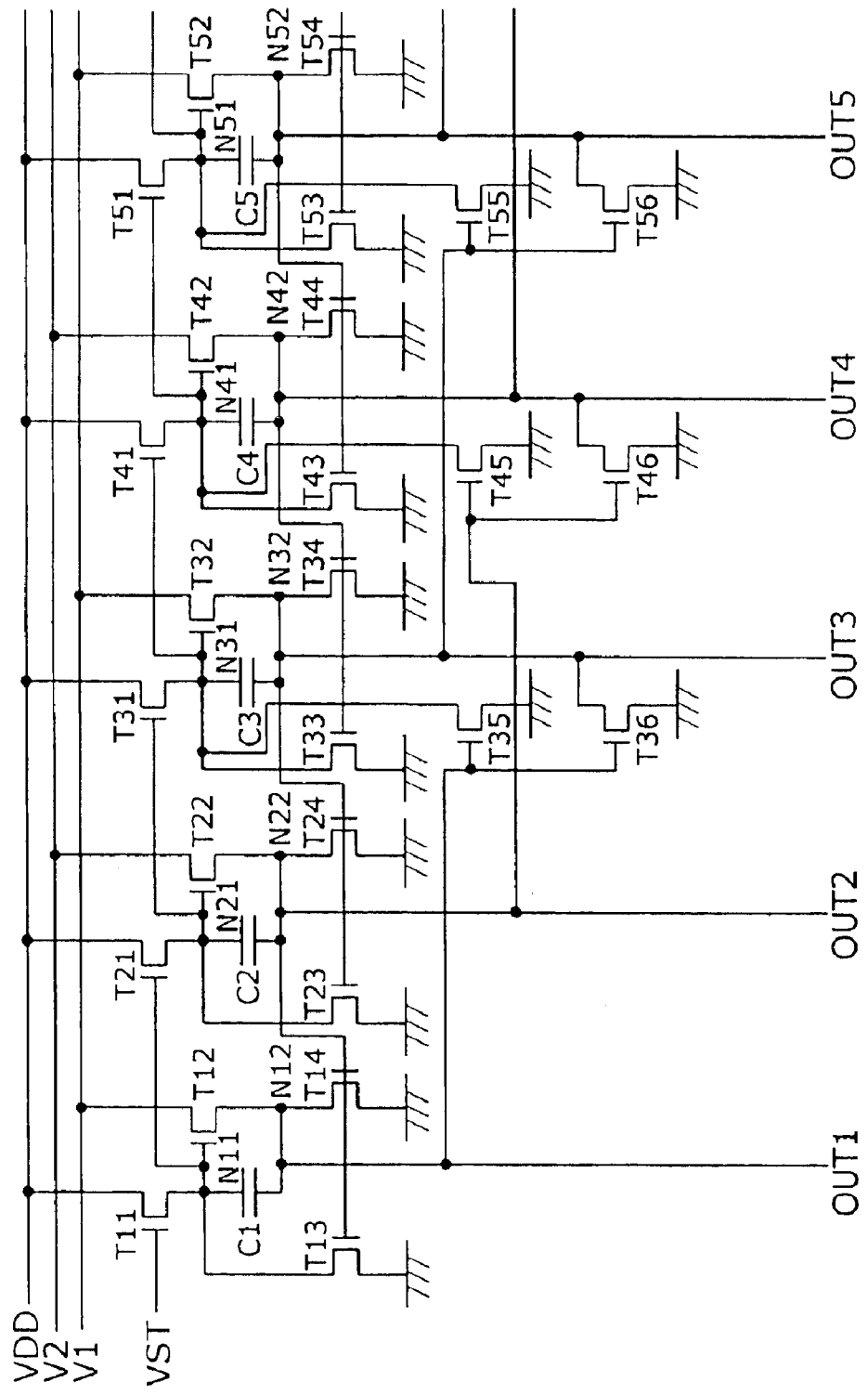
FIG. 7 is a circuit diagram of the error operation preventative signal transmission circuit according to the third embodiment of the present invention.

FIG. 7 is a structure example of the signal transmission circuit according to the third embodiment of the present invention.

The signal transmission circuit comprises plural stages of circuit, wherein each pulse voltage according to the driving pulse is sequentially outputted. Here, the circuit structure of the five stages is shown.

The error operation preventative signal transmission circuit is different from the conventional error operation preventative signal transmission circuit as shown in FIG. 1 in that in the third and backward stages the second error operation preventative transistor T36 (T46, T56) are set. For example, the drain of the second error operation preventative transistor T36 is connected to the source of the output transistor T32 of the same stage; the gate of the second error operation preventative transistor T36 is connected to the source of the output transistor T12 of the two stages forward; and the source is earthed.

According to this structure, even if the pulse voltage is outputted to the sources of the output transistor T32 (T42, T52) of the third and backward stages, due to error operation, the output pulse of the two stages forward is applied to the gate of the second error operation preventative transistor T36 (T46, T56); thereby the second error operation preventative transistor T36 (T46, T56) are on. Consequently, it is possible to make each potential of the output pulse of the third and backward stages the earth voltage; thus the pulse voltage is prevented from occurring, due to error operation of the source of the output transistor of the third and backward stages.

(Fourth Embodiment)

Figure 8:
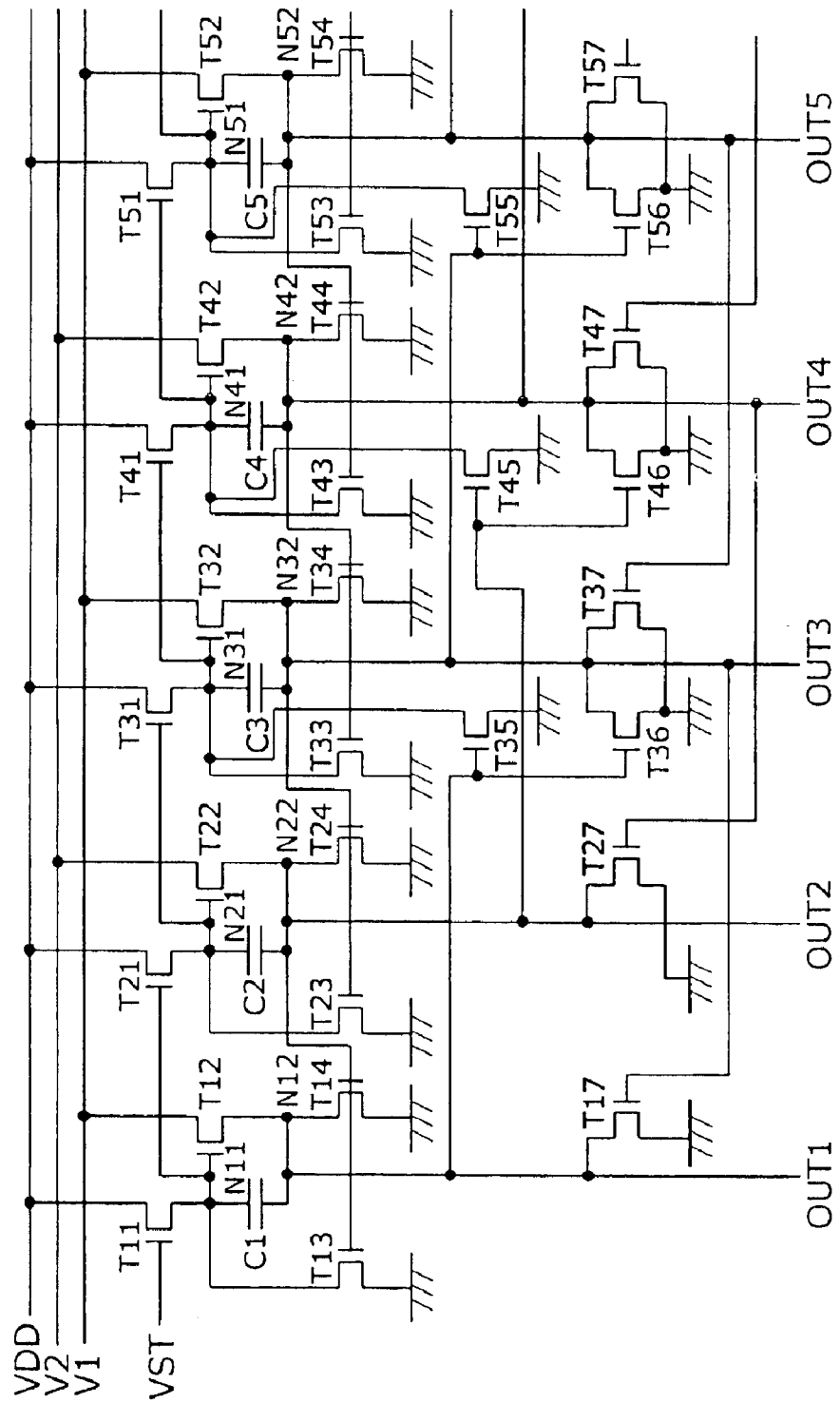
FIG. 8 is a circuit diagram of the error operation preventative signal transmission circuit according to the fourth embodiment of the present invention.

FIG. 8 is a structure example of the signal transmission circuit according to the fourth embodiment of the present invention.

In the present embodiment, in addition to the error operation preventative measures of the third embodiment, when the output pulse is outputted from the corresponding output transistor, the output pulse is prevented from outputting from the output transistor of the circuit which is more than two stages forward.

Therefore, the signal transmission circuit is equipped with the third error operation preventative transistor T17 (T27, T37, T47, T57), in addition to the signal transmission circuit as shown in FIG. 7.

For example, in the third error operation preventative transistor T17, the drain of T17 is connected to the source of the output transistor T12; the gate is connected to the source of the two-stage forward output transistor T32; and the source is earthed.

As the fast operation of the circuit advances, the time for discharging the bootstrap capacitor C1–C5 is shortened. However, if sufficient discharging time is not provided, some electric charge remains without discharging in the bootstrap capacitor C1–C5. Due to this residual electric charge in the bootstrap capacitor C1–C5, if the voltage higher than the threshold voltage of the output transistor T12–T52 is applied to the gate of the output transistor T12–T52, the pulse voltage may be outputted to the sources of the two-stage forward output transistor T12–T52, due to error operation.

For the fast operation of the circuit, each threshold voltage of the output transistor T12–T52 is often set low, and the probability of error operation becomes high. As for the operation of the fourth embodiment, the case in which the desired pulse voltage is outputted to the output pulse OUT 3 will be explained as an example. In this case, even if the pulse voltage is outputted to the source of the two-stage forward output transistor T12, due to error operation, the pulse voltage of the output pulse OUT3 is applied to the gate of the two-stage forward third error operation preventative transistor T17; thus the third error operation preventative transistor T17 is on. Therefore, it is possible to make the two-stage forward pulse voltage the earth voltage.

Thus, according to the present embodiment, when the desired pulse voltage is outputted, even if the pulse voltage is outputted to the source of the two-stage forward output transistor, due to error operation, the third error operation preventative transistor is on. Consequently, it is possible to prevent the pulse voltage from occurring to the source of the two-stage forward output transistor, due to error operation.

(Fifth Embodiment)

Figure 9:
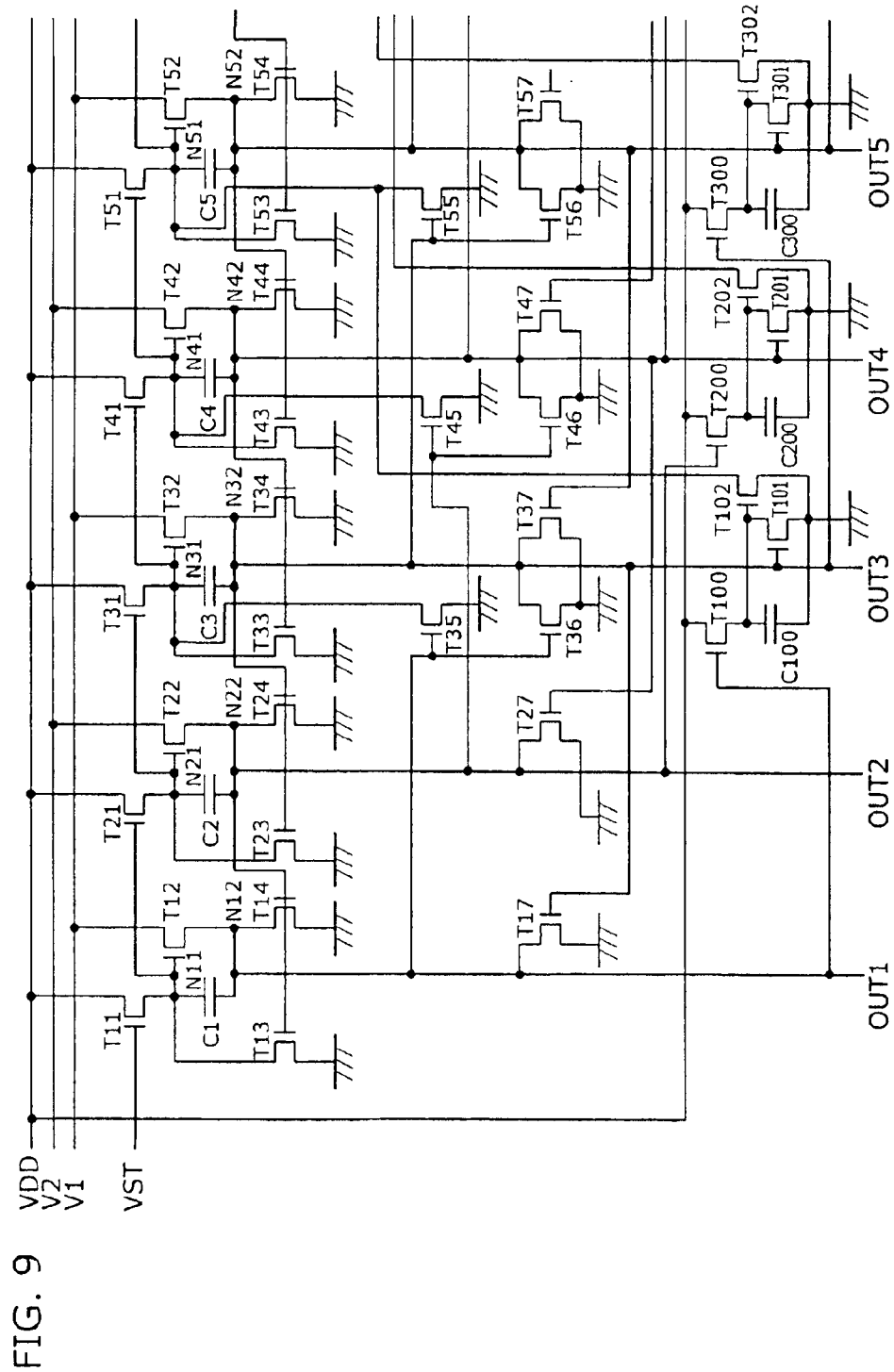
FIG. 9 is a circuit diagram of the error operation preventative signal transmission circuit according to the fifth embodiment of the present invention.

FIG. 9 is a structure example of the signal transmission circuit according to the fifth embodiment of the present invention. In addition to the measures of the third and fourth embodiments, the fifth embodiment utilizes measures to prevent the output pulse from outputting from the output transistor placed more than four stages backward from the corresponding output transistor before the output pulse is outputted from the corresponding output transistor.

In addition to the signal transmission circuit shown in FIG. 8, the signal transmission circuit shown in FIG. 9 comprises the voltage holding capacitor C100–C300, the voltage holding capacitor charging transistor T100–T300, the third discharging transistor T101–T301 and the fourth error operation preventative transistor T102–T302.

For example, as for the voltage holding capacitor charging transistor T100, the pulse voltage sequentially outputted from the corresponding output transistor T12 is applied to the gate; the drain is connected to the source line; and the source is connected to the plus terminal of the voltage holding capacitor C100.

Also, as for the third discharging transistor T101, the pulse voltage of the two stages backward from the corresponding output transistor T12 is applied to the gate and the drain is connected to the plus terminal of the voltage holding capacitor C100.

Furthermore, as for the fourth error operation preventative transistor T102, the drain is connected to the gate of the output transistor T15 which is four stages backward from the corresponding output transistor T12; and the gate is connected to the plus terminal of the voltage holding capacitor C100.

Figure 10:
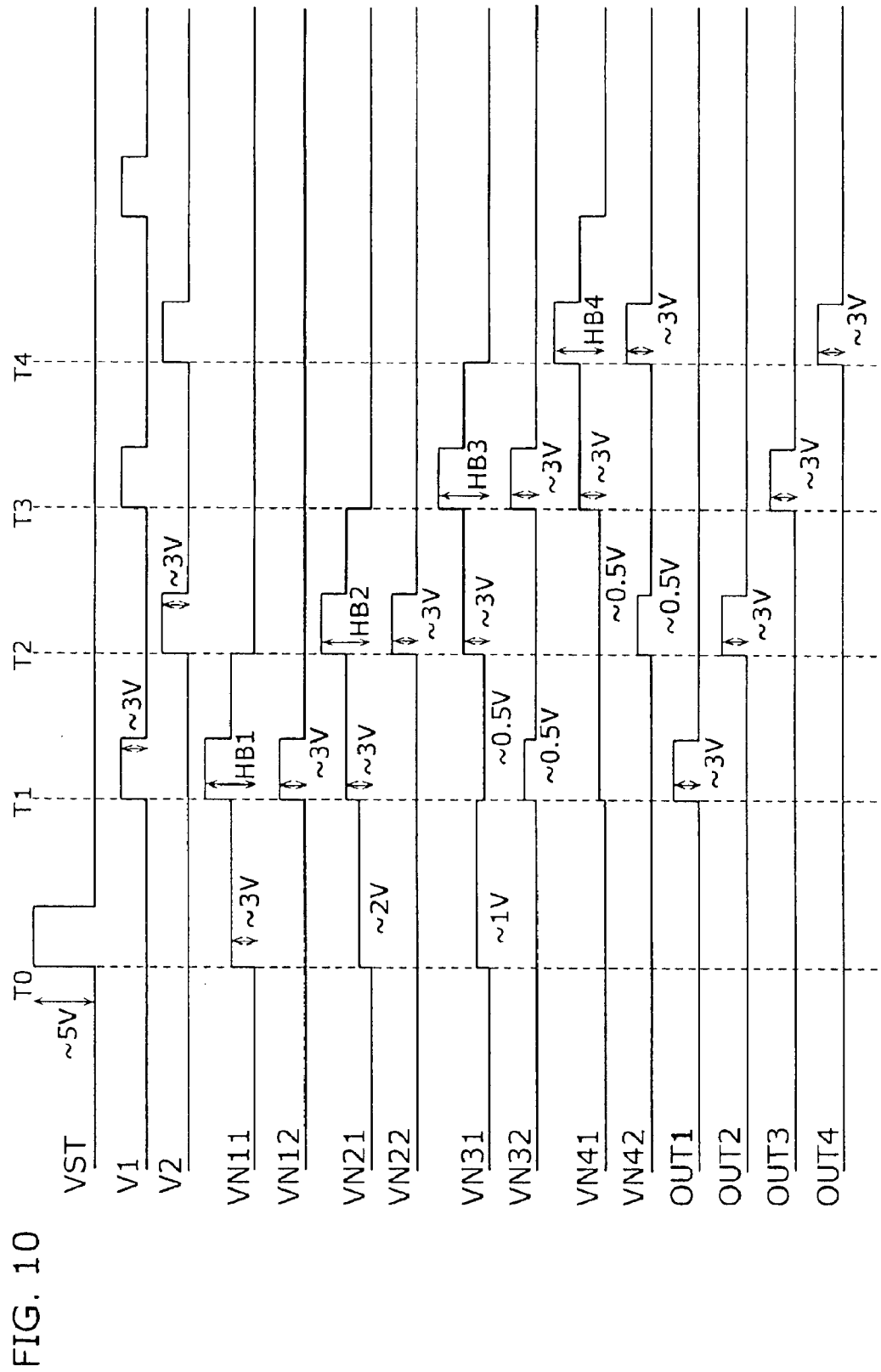
FIG. 10 is an operational time chart according to the fifth embodiment of the present invention.

The specific operations will be further explained referring to FIG. 10. FIG. 10 is a time chart showing the pulse voltage of each unit in the signal transmission circuit according to the fifth embodiment. This circuit is a 3V type circuit, wherein the voltage amplitude of the driving pulses V1 and V2 and the source voltage VDD are 3V. However, the voltage amplitude of the start pulse VST is 5V. The reason why only the voltage amplitude of the start pulse VST is 5V is because only in the bootstrap capacitor charging transistor T1 of the first stage where the start pulse VST is inputted, the high voltage from the previous stage cannot be provided; thus only the start pulse VST drives the transistor T11 with 5V higher than 3V, the voltage amplitude of the driving pulses V1 and V2; thereby the voltage is prevented from falling in the transistor T11; and the bootstrap capacitor C1 is enabled to be charged to 3V of the source voltage VDD.

In FIG. 10 at the time T0, when the start pulse VST rises to 5V, the bootstrap capacitor charging transistor T11 of the first stage turns on; thus the bootstrap capacitor C1 starts to get charged toward the source voltage VDD. Here, in the case the bootstrap capacitor charging transistor T11 is an enhancement type, NMOS, because of the influence of the threshold voltage Vt1 of the transistor T11, the voltage VN11 of the node N11 where the gate of the output transistor T12 is connected becomes the voltage (3V−Vt1) which is lower than 3V of the source voltage VDD by the threshold voltage Vt1; and in this state the output transistor T12 turns on.

At the time T1, when the driving pulse V1 of 3V is inputted into the drain of the output transistor T12, the voltage HB1 which is the combination of the voltage 3V of the driving pulse V1 and the potential difference of the both ends of the bootstrap capacitor C1 (3V−Vt) is applied to the gate (the node N11) of the output transistor T12; and the pulse with the amplitude of H1 is outputted from the node N12.

At the same time, the voltage HB1 of the node N11 is applied to the gate of the bootstrap capacitor charging transistor T21 of the second stage; thereby the transistor T21 turns on. Then, the bootstrap capacitor C2 is charged to the source voltage VDD which does not fall for the threshold voltage of the transistor T21. When the charging voltage (the node N21) of the bootstrap capacitor C2 exceeds the threshold voltage of the output transistor T22, the output transistor T22 of the second stage turns on. Simultaneously, the voltage of the node N21 is applied to the gate of the bootstrap capacitor charging transistor T31 of the third stage. Therefore, the transistor T31 turns on; and the bootstrap capacitor C3 is charged up to the voltage (3V−Vt3) which is lower than 3V of the source voltage VDD by the threshold voltage Vt3.

In this state, in the case the driving pulse V1 is 3V of the logical "High" level, when the driving pulse V1 is outputted to the output node N12 of the first stage, at the same time, the pulse with the amplitude less than the driving pulse V1 is outputted to the output node N32 of the third stage. To solve this problem, the electric potential of the plus terminal of the bootstrap capacitor C3 is set close to the earth voltage; and in order for the output transistor T32 of the third stage to turn off, the error operation preventative transistor T35 is connected between the plus terminal of the bootstrap capacitor C3 and the earth voltage. In other words, the drain of the error operation preventative transistor T35 is connected to the plus terminal of the bootstrap capacitor C3; the source is connected to the earth voltage; and the gate is connected to the output node N12 of the first stage. In this manner, when the driving pulse V1 appears in the output node N12 of the first stage, the error operation preventative transistor T35 turns on; the node N31 is set close to the earth voltage; and the driving pulse V1 is prevented from appearing in the output node N32 of the third stage.

Also, the drain of the error operation preventative transistor T45 is connected to the plus terminal of the bootstrap capacitor C4 of the backward stage; the source of the error operation preventative transistor T45 is connected to the earth voltage; the gate of the error operation preventative transistor T45 is connected to the output node N22 of the two stages forward; thereby the error operation is prevented through all the stages. However, in the processes of the low-voltage driving and the fast operations of the circuit, it is necessary to set the threshold voltage of the output transistor such as the output transistor T32; and the voltage applied to the gate of the output transistor T52 must be set as close the amount as the earth voltage.

In other words, at the time T1, when the driving pulse V1 of 3V is inputted into the drain of the output transistor T12, the voltage HB1 is applied to the gate (the node N11) of the output transistor T12, said voltage HB1 being the combination of 3V of the voltage of the driving pulse V1 and the potential difference (3V–Vt) of the both ends of the bootstrap capacitor C1. At the same time, the voltage HB 1 of the node N11 is applied to the gate of the bootstrap capacitor charging transistor T21 of the second stage; and the transistor T21 turns on. Then, the bootstrap capacitor C2 (the node N21) is charged to the source voltage VDD which does not fall for the threshold voltage of the transistor T21. Here, at the same time, the voltage of the node N21 is applied to the gate of the bootstrap capacitor charging transistor T31 of the third stage; and the transistor T31 turns on. Then, the bootstrap capacitor C3 (the node N31) is charged to the voltage (3V–Vt3) which is lower than 3V of the source voltage VDD by Vt3 of the threshold voltage of the transistor T31. At the same time, the voltage of the node N31 is applied to the gate of the bootstrap capacitor charging transistor T41 of the fourth stage; and the transistor T41 turns on. Then, the bootstrap capacitor C4 (the node N41) is charged to the voltage (3V–Vt3–Vt4) which is lower than 3V of the source voltage VDD by Vt3 and Vt4 of the threshold voltage of the transistor T31 and T41. At the same time, the voltage of the node N41 is applied to the gate of the bootstrap capacitor charging transistor T51 of the fifth stage; and the transistor T51 turns on. Then, the bootstrap capacitor C5 (the node N51) is charged to the voltage (3V–Vt3–Vt4–Vt5) which is lower than 3V of the source voltage VDD by Vt3, Vt4 and Vt5 of the threshold voltage of the transistor T31, T41 and T51.

In this state, in the case the driving pulse V1 is 3V of the logical "High" level, when the driving pulse V1 is outputted to the output node N12 of the first stage, at the same time, the pulse with the amplitude less than the driving pulse V1 might be outputted to the output node N52 of the fifth stage. To solve this problem, the plus terminal of the bootstrap capacitor C5 is set close to the earth voltage; and in order for the output transistor T52 of the fifth stage to turn off, the fourth error operation preventative transistor T102 is connected between the plus terminal of the bootstrap capacitor C5 and the earth voltage. As for the fourth error operation preventative transistor T102, when the desired pulse voltage is outputted, the charging transistor T100 turns on; the capacitor C100 is charged with the voltage around the VDD voltage; the fourth error operation preventative transistor T102 turns on; and the output transistor of the fifth stage is controlled in order for the source of the T52 to discharge. The pulse voltage of the third stage is outputted; the discharging transistor T101 turns on; the capacitor C100 is discharged; and the fourth error operation preventative transistor T102 is controlled to be off.

According to the fifth embodiment, even in the case the threshold voltage of the output transistor is low; the error operation can be prevented; thus the range of the threshold voltage can be large.

(Sixth Embodiment)

Figure 11:
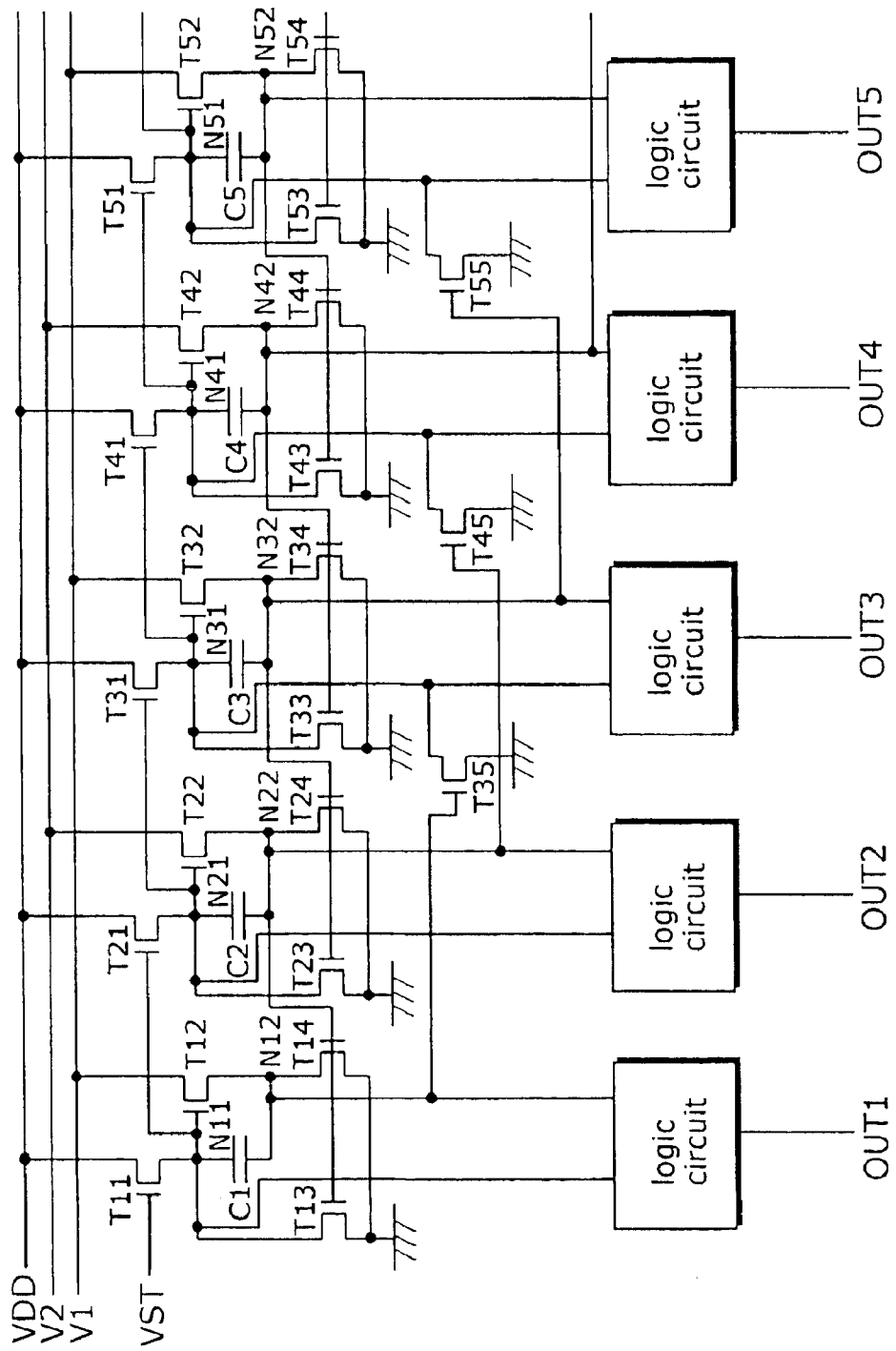
FIG. 11 is a circuit diagram of the error operation preventative signal transmission circuit according to the sixth embodiment of the present invention.

FIG. 11 is a schematic diagram of the signal transmission circuit according to the sixth embodiment of the present invention. The signal transmission circuit comprises plural stages of circuit; and the pulse voltage according to the driving pulse is sequentially outputted from the circuit of each stage. FIG. 11 shows only five stages.

The signal transmission circuit in FIG. 11 is different from the conventional signal transmission circuit in FIG. 1 in that each circuit includes a logical circuit. In the case the source voltage of the output transistor T12 (T22–T52) is at "High" level the logical circuit outputs the voltage signal of "High" level; and in the case the source voltage of the output transistor T12 (T22–T52) is at "Low" level, the logical circuit outputs the voltage signal of "Low" level, according to the gate voltage of the output transistor T12 (T22–T52).

According to this structure, only in the circuit of the stages where the original pulses are caused, the pulses are outputted to the OUT terminal as usual; in the circuit of the other stages, even if the pulses are outputted by error operation, the output pulses are blocked by the switching circuit. Thus, from the viewpoint of the OUT terminals of the signal transmission circuit, the pulses are scanned normally; and the surrounding circuit is free from any bad influence. In other words, it is possible to provide the signal transmission circuit which can output the pulses to the external OUT terminals as usual, even if error operation occurs inside the signal transmission circuit.

(Seventh Embodiment)

Figure 12:
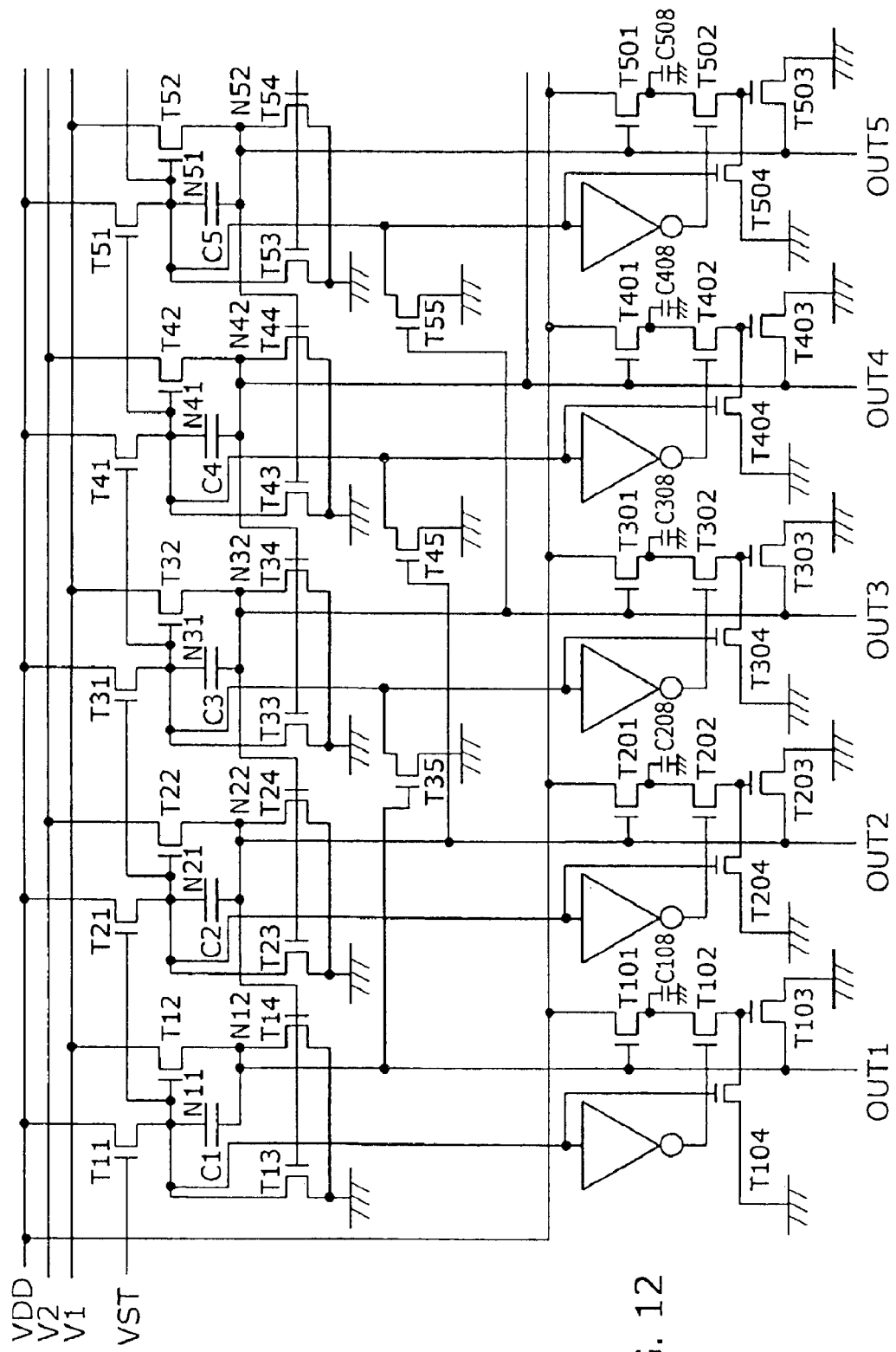
FIG. 12 is a circuit diagram of the error operation preventative signal transmission circuit according to the seventh embodiment of the present invention.

FIG. 12 is a structure example of the signal transmission circuit according to the seventh embodiment of the present invention. In this signal transmission circuit, The logical circuit of the signal transmission circuit according to the sixth embodiment are embodied. In FIG. 12 The logical circuit includes the first transistor T101 (T201–T501), the inverter circuit, the second transistor T102 (T202–T502), the third transistor T103 (T203–T503), and the fourth transistor T104 (T204–T504).

In the first transistor T101 (T201–T501), each drain is connected to the power source; and each gate is connected to each source of the output transistor T12 (T22–T52). The inverter circuit receive each gate of the output transistor T12 (T22–T52) as the input. In the second transistor T102 (T202–T502), each gate is connected to the output of the inverter circuit. In the third transistor T103 (T203–T503), each drain is connected to the source of the output transistor of the circuit of each stage; each gate is connected to the source of the transistor T102 (T202–T502); and each source is connected to the earth line. In the fourth transistor T104 (T204–T504), each gate is connected to each gate of the output transistor T12 (T22–T52); each drain is connected to each, gate of the transistor T103 (T203–T503). Also, each source of the first transistor T101 (T201–T501) is connected to each drain of the second transistor T102 (T202–T502).

Figure 13:
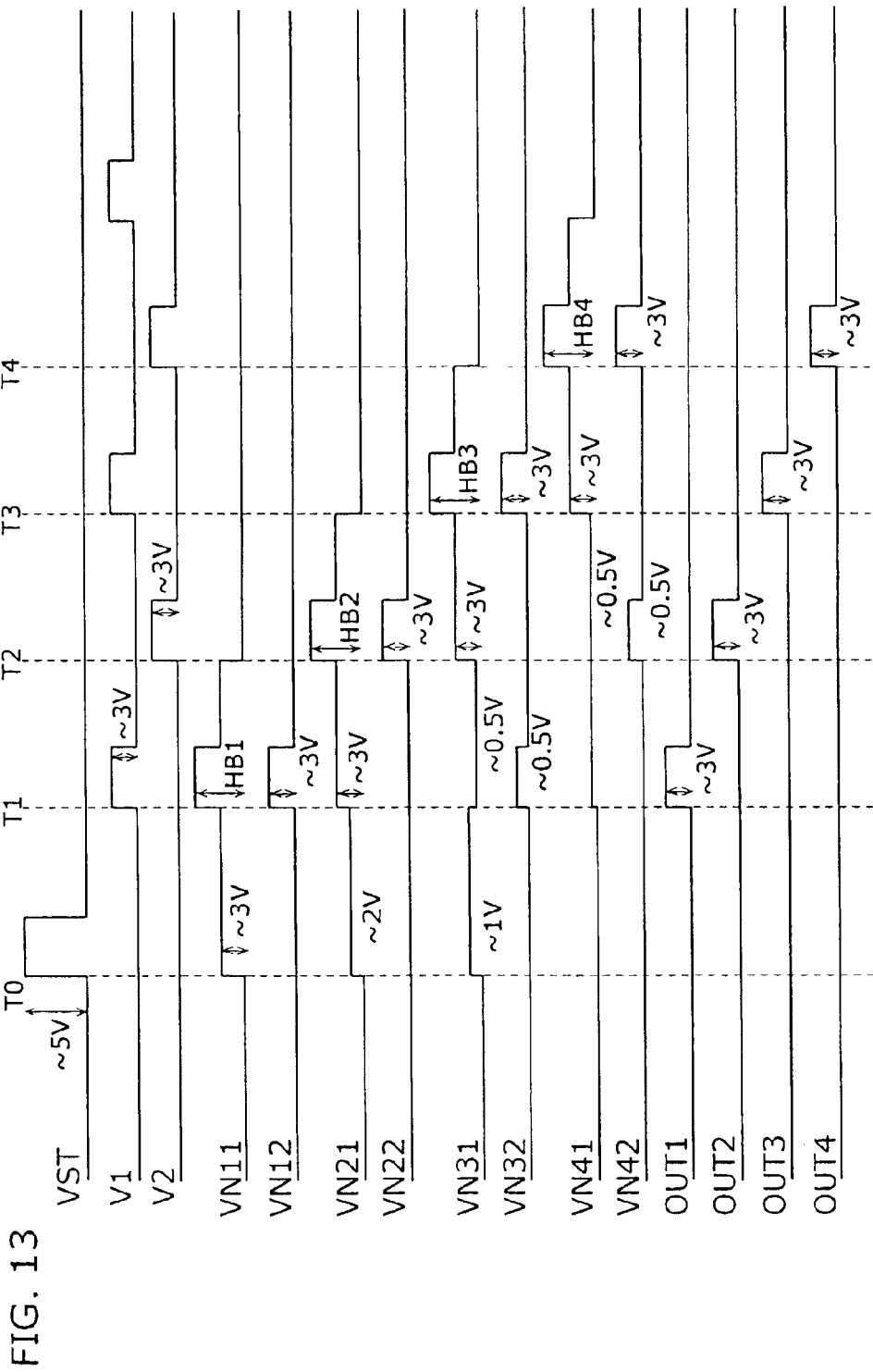
FIG. 13 is an operational time chart according to the seventh embodiment of the present invention.

The specific operations of the signal transmission circuit as shown in FIG. 12 will be explained, referring to FIG. 13. FIG. 13 is a time chart showing the pulse voltage of each unit in the signal transmission circuit according to the seventh embodiment. This circuit is a 3V type circuit, wherein the voltage amplitude of the driving: pulses V1 and V2 and the source voltage VDD are 3V. However, the voltage amplitude of the start pulse VST is 5V. Here, the reason why only the voltage amplitude of the start pulse VST is 5V is because only in the bootstrap capacitor charging transistor T11 of the first stage where the start pulse VST is inputted, the high voltage of the previous stage cannot be provided. Thus, only the start pulse VST drives the transistor T11 with the voltage amplitude 5V which is higher than 3V of the driving pulses V1 and V2; the voltage is prevented from falling in the transistor T11; and it is possible to charge the bootstrap capacitor C1 to 3V of the source voltage VDD.

In FIG. 13 at the time T0, when the start pulse VST rises to 5V, the bootstrap capacitor charging transistor T11 of the first stage turns on; and the bootstrap capacitor C1 starts to get charged toward the source voltage VDD. Here, even if the bootstrap capacitor charging transistor T11 is an enhancement type, NMOS, without the influence of the threshold voltage Vt1 of the transistor T11, the voltage VN11 of the node N11 is charged to 3V of the source voltage VDD, said node N11 being connected to the gate of the output transistor T12; and the output transistor T12 turns on.

Next, at the time T1, when the driving pulse V1 of 3V is inputted into the drain of the output transistor T12, the high voltage HB1 is applied to the gate (the node N11) of the output transistor T12, said voltage HB1 being the combination of 3V of the driving pulse V1 and 3V of the potential difference of the both ends of the bootstrap capacitor C1; and the driving pulse V1 of the amplitude 3V is certainly outputted as the output pulse OUT1 from the node N12. At the same time, the voltage HB1 of the node N11 is applied to the gate of the bootstrap capacitor charging transistor T2 of the second stage; and the transistor T21 turns on. Then, the bootstrap capacitor C2 is charged to the source voltage VDD which does not fall for the threshold voltage of the transistor T21. When the charging voltage (the node N21) of the bootstrap capacitor C2 exceeds the threshold voltage of the output transistor T22, the output transistor T22 of the second stage turns on. At the same time, the voltage of the node N21 is applied to the gate of the bootstrap capacitor charging transistor T31 of the third stage. Thus, the transistor T31 turns on; and the bootstrap capacitor C3 is charged to the voltage (3V–Vt3) which is lower than 3V of the source voltage VDD by the threshold voltage Vt3. In this state, in the case the driving pulse V1 is 3V of the logical "High" level, when the driving pulse V1 is outputted to the output node N12 of the first stage, at the same time, the pulse with the amplitude lower than the driving pulse V1 is outputted to the output node N32 of the third stage. In such case as described above, according to the seventh embodiment, only the driving pulse V1 of the output node N12 of the first stage is outputted to the OUT terminal; and the pulse with the amplitude lower than the driving pulse V1 cannot be caused to the OUT3 terminal, said driving pulse V1 being caused in the output node N32 of the third stage.

In other words, in order to output the potential of the node N12 of the first stage to the OUT1 terminal, at the time T1, the third transistor T103 of the first stage is turned off; and the third transistor T303, T403 and the like of the third stage and the stages backward of the third stage.

In other words, the operations of each node of the circuit of each stage are as following: (i) the gate voltage (the node N11) of the output transistor T11 is at "High" level, (ii) the voltage is applied to the gate of the fourth transistor T104, and (iii) the turnover voltage of "Low" level is applied to the gate of the second transistor T102. Thus, the gate of the third transistor T103 becomes "Low" level; and it is possible to output the driving pulse V1 to the OUT1 terminal by the source voltage (the node N12) of the output transistor T11.

On the other hand, the operations of each node of the circuit of the third stage are as following: (i) the gate voltage (the node N31) of the output transistor T31 is at "Low" level, (ii) the voltage is applied to the gate of the fourth transistor T304, and (iii) the turnover voltage of "High" level is applied to the gate of the second transistor T302. Thus, the gate of the third transistor T303 becomes "High" level in the case the pulse with the amplitude less than the driving pulse V1 is outputted to the source voltage (the node N32) of the output transistor; and the first transistor T301 turns on. Even if the pulse with the amplitude less than the driving pulse V1 is outputted to the source voltage (the node N32) of the output transistor, the gate of the third transistor T303 can make the OUT3 terminal the ground level. Thus, only the pulse output is outputted to the OUT terminal. As for the input logical level of the inverter circuit which generates the gate turnover voltage of the output transistor of the circuit of each stage, setting the input "High" level a high voltage can contribute to the operational stability. Also, as for the threshold voltage of the first transistor of the circuit of each stage, setting the input "High" level a low voltage can contribute to the operational stability.

(Eighth Embodiment)

Figure 14:
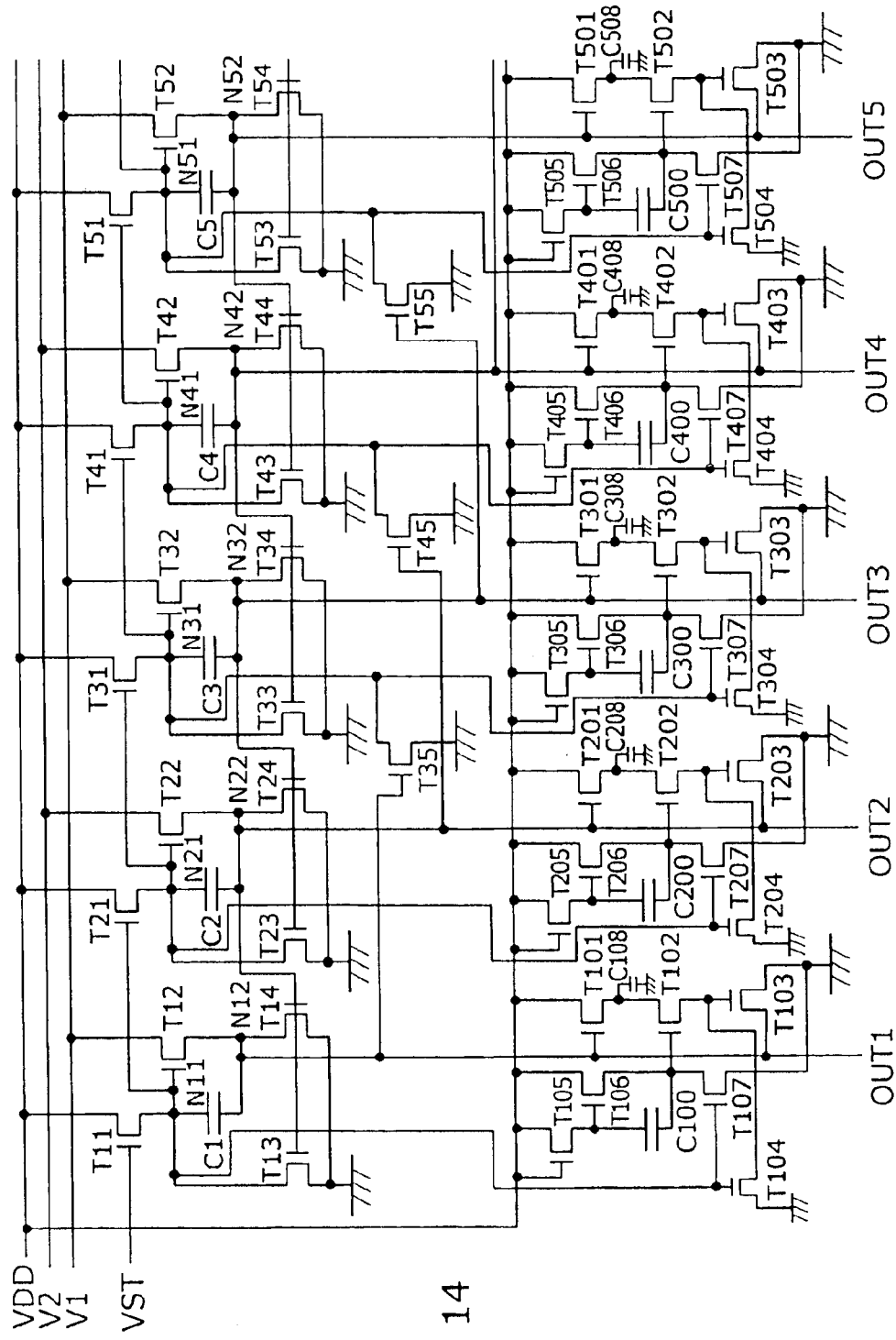
FIG. 14 is a circuit diagram of the error operation preventative signal transmission circuit according to the eighth embodiment of the present invention.

FIG. 14 is a structure example of the signal transmission circuit according to the eighth embodiment of the present invention. The signal transmission circuit in FIG. 14 comprises the embodied inverter circuit of the signal transmission circuit in FIG. 12.

The inverter circuit includes the fifth transistor T105 (T205–T505), the sixth transistor T106 (T206–T506), the second bootstrap capacitor C100 (C200–C500), and the seventh transistor T107 (T207–T507).

As for the fifth transistor T105 (T205–T505), each gate and each drain are connected to the power source. As for the sixth transistor T106 (T206–T506), each drain is connected to the power source, and each gate is connected to each source of the fifth transistor T105 (T205–T505). The both ends of the second bootstrap capacitor C100 (C200–C500) are respectively connected to the gate and the source of the sixth transistor T106 (T206–T506). As for the seventh transistor T107 (T207–T507), each drain is connected to the source of the fifth transistor T105 (T205–T505), and each gate is connected to each gate of the output transistor T12 (T22–T52) of the circuit of each stage. The node is connected to each gate of the second transistor T102 (T202–T502), said node being each source of the sixth transistor T106 (T206–T506) and each drain of the seventh transistor T107 (T207–T507).

In other words, the inverter circuit which forms the gate turnover voltage of the output transistor T12 (T22–T52) of the circuit of each stage only by NMOS are used. In the inverter circuit, setting each threshold voltage of the seventh transistor T107 (T207–T507) high can contribute to the better operational stability. Also, it is desirable to set each threshold voltage of the seventh transistor T107 (T207–T507) of the circuit of each stage higher than each threshold voltage of the first transistor T101 (T201–T501).

Moreover, it is desirable (i) to set each channel length of the seventh transistor T107 (T207–T507) shorter than each channel length of the first transistor T101 (T201–T501) and (ii) to set the resistance value of the first transistor T101 (T201–T501) lower than that of the seventh transistor T107 (T207–T507).

The power source can be commonly connected to all the signal transmission circuits, said power source being connected to (i) each drain of the first transistor T101 (T201–T501) of the circuit of each stage, (ii) each drain and gate of the fifth transistor T105 (T205–T505), and (iii) each drain of the sixth transistor T106 (T206–t506).

Figure 15:
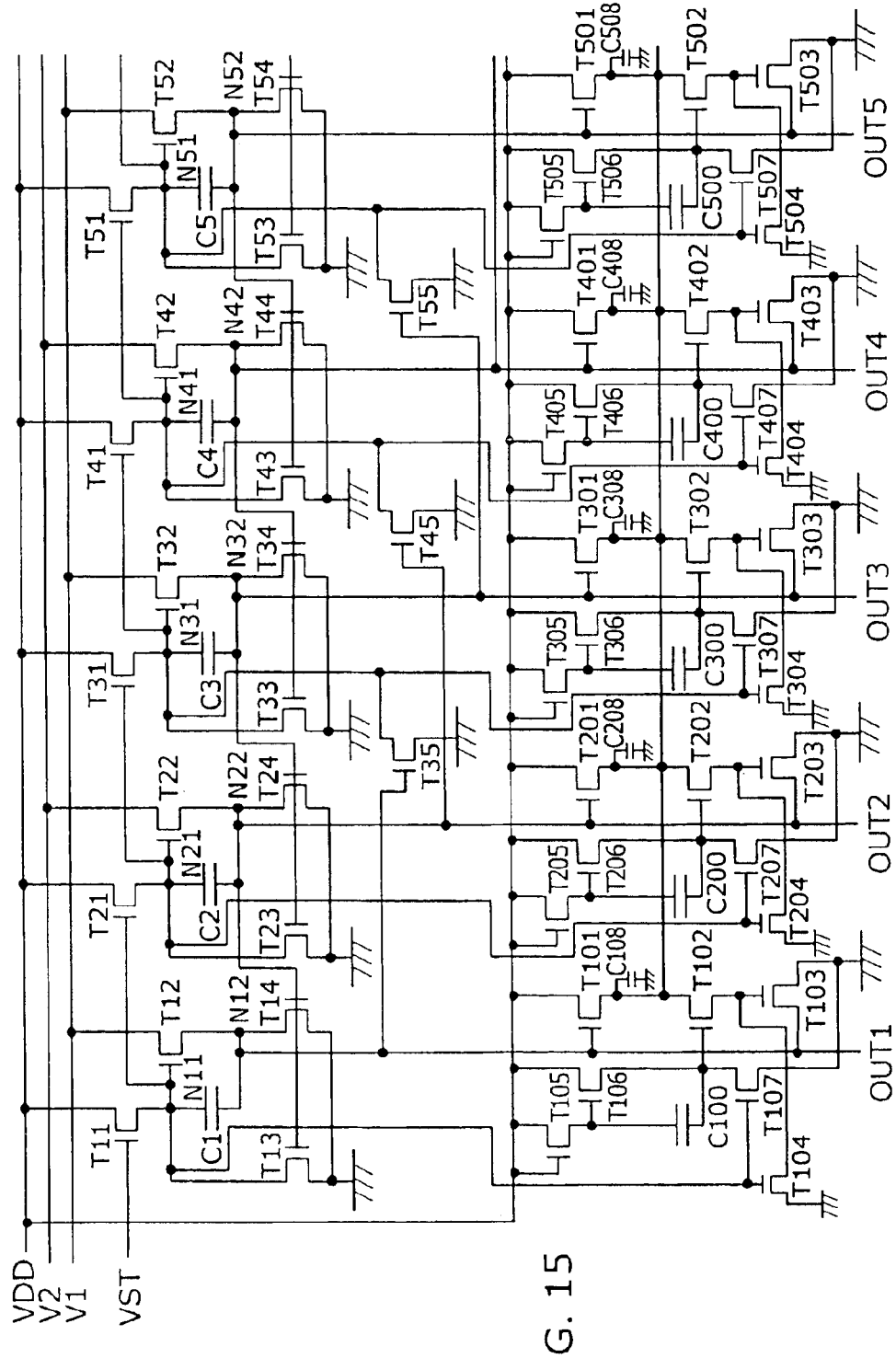
FIG. 15 is a circuit diagram of the error operation preventative signal transmission circuit according to the other embodiments of the present invention.

Also, as FIG. 15 shows, the node can be commonly connected to all the signal transmission circuits, said node being connected to (i) each source of the first transistor T101 (T201–T501) of the circuit of each stage and (ii) each drain of the second transistor T102 (T202–T502).

According to the sixth, seventh and eighth embodiments, each source of the discharging transistor and the error operation preventative transistor is the earth voltage (0V);

however, as for each source voltage, it is possible to acquire the similar effects, even if the voltage lower than the threshold voltage of the output transistor is provided to each source of the first error operation preventative transistor and the first discharging transistor.

Figure 16:
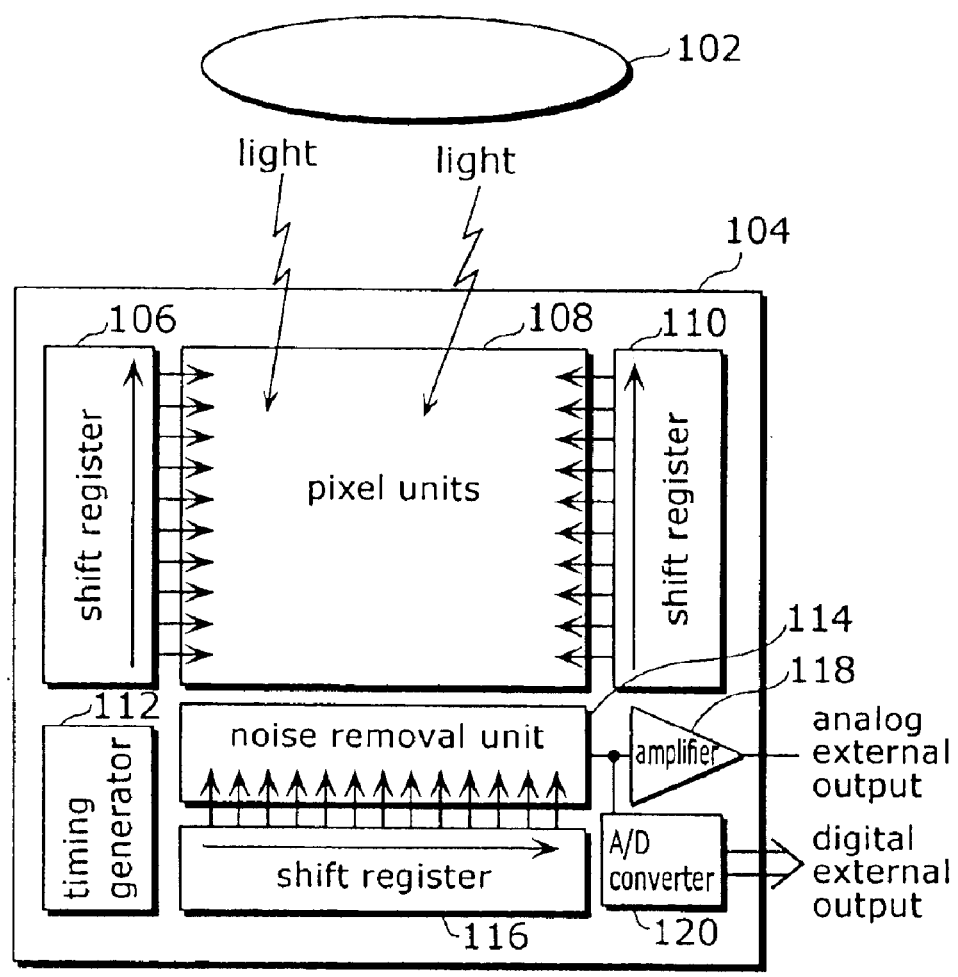
FIG. 16 is a block diagram of the solid image sensor comprising the error operation preventative signal transmission circuit according to the embodiment of the present invention.

It is possible to utilize such signal transmission circuit as described above as a shift register for a solid image sensor or liquid crystal display (LCD) apparatus. FIG. 16 shows an example of such solid image sensor.

The solid image sensor comprises: a lens102 collecting lights, pixel units108 accumulating the collected lights, vertical shift registers106 and 110 for accessing each row of the pixel units108, a noise removal unit114 for eliminating noise component of the pixel value detected from the pixel units108, a horizontal shift register116 for accessing the pixel value for each column and outputting the pixel value for each pixel, an amplifier118 for amplifying the detected pixel value, an A/D converter120 for A/D converting the detected pixel value, and a timing generator112 for generating the timings for detecting the pixel value from each pixel.

It is possible to accurately detect the pixel value by utilizing the signal transmission circuit according to an embodiment of the present invention for such solid image sensor as described above. Also, it is possible to apply the signal transmission circuit to the LCD apparatus.

The signal transmission circuit according to the embodiments of the present invention has been explained as above; however, the present invention is not limited to these embodiments.

For example, in the first and second embodiments, only NMOS can be used for the transistor; NMOS capacitor can be used for the capacitor; and all the circuit elements can be formed by NMOS.

Also, in the first and second embodiments, it is desirable to set the threshold voltage of the output transistor the lowest in the circuit of each stage.

In addition, in the first and second embodiments, it is possible to acquire the similar effects even if the potential of the source of the third discharging transistor is set lower than the threshold voltages of the first discharging transistor and the second discharging transistor.

Moreover, in the first and second embodiments, it is possible to acquire the similar effects even if the voltage lower than the threshold voltage of the output transistor is provided to the source of the first discharging transistor.

In the third, fourth and fifth embodiments, each source of the discharging transistor and error operation preventative transistor is the earth voltage (0V); however, as for each source voltage, it is possible to acquire similar effects even if the voltage lower than the threshold voltage of the fourth error operation preventative transistor is provided to the source of the third discharging transistor in the fifth embodiment.

Also, it is possible to acquire the similar effects even if the voltage lower than the threshold voltage of the output transistor is provided to each source of the error operation preventative transistor and the first discharging transistor in the third, fourth and fifth embodiments.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The signal transmission circuit of the present invention can be utilized; for the MOS solid image sensor and LCD apparatus which need low power consumption and fast operation.

What is claimed is:

1. A signal transmission circuit comprising plural stages of circuit from each of which a pulse voltage according to a driving pulse is sequentially outputted, the circuit of each stage including:

an output transistor which outputs the pulse voltage to a source of the output transistor, according to the driving pulse;

a bootstrap capacitor connected between a gate of the output transistor and the source;

a first charging transistor whose drain is connected to a power source or an earth line and whose source is connected to the gate of the output transistor in order to charge the bootstrap capacitor, wherein in the case where a first discharging transistor is in the first stage, a start pulse is provided to the gate of the first discharging transistor, and in the case where the first discharging transistor is in the second stage or backward, the gate of the first discharging transistor is connected to the gate of the output transistor of the forward stage;

a first discharging transistor whose drain is connected to one end of the bootstrap capacitor;

a second discharging transistor whose drain is connected to the other end of the bootstrap capacitor; and an output transistor control circuit which prevents the pulse voltage from being outputted from the output transistor of each circuit of the other stages, in the case the pulse voltage is outputted from the source of the output transistor.

2. The signal transmission circuit according to claim 1, wherein the output transistor control circuit is a logical circuit which (i) turns on the first and second discharging transistors, according to the driving pulse for each circuit of the other stages, and (ii) turns off the first and second discharging transistors, according to the gate signal of the charging transistor.

3. The signal transmission circuit according to claim 2, wherein the logical circuit has:

a voltage holding capacitor;

a second charging transistor whose drain is connected to a power source, whose gate is provided with a driving pulse of the circuit of each stage, and whose source is connected to the voltage holding capacitor;

a third discharging transistor whose drain is connected to the source of the second charging transistor, whose gate is connected to the gate of the first charging transistor, and whose source is connected to the earth line, wherein as for the voltage holding capacitor, (i) one of the electrodes is connected to the source of the second charging transistor and the drain of the third discharging transistor, (ii) the other of the electrodes is connected to the earth line, (iii) the source of the second charging transistor is connected to the gate of the first discharging transistor, and (iv) the drain of the third discharging transistor is connected to the gate of the second discharging transistor.

4. The signal transmission circuit according to claim 3, wherein the electric potential of the source of the third discharging transistor is set lower than the threshold voltages of the first and second discharging transistors.

5. The signal transmission circuit according to claim 2, wherein all transistors and all capacitors are formed by NMOS.

6. The signal transmission circuit according to claim 2, wherein the threshold voltage of the output transistor is set the lowest in the circuit of each stage.

7. The signal transmission circuit according to claim 2, wherein all the transistors are NMOS, and each source of the first to third discharging transistors is connected to the earth voltage.

8. The signal transmission circuit according to claim 2, wherein all the transistors are NMOS, and the source of the first discharging transistor is provided with the voltage lower than the threshold voltage of the output transistor.

9. The signal transmission circuit according to claim 1, wherein the gate of the first discharging transistor is further connected to the source of the output transistor of the next stage;
the gate of the second discharging transistor is connected to the source of the output transistor of the next stage;
the output transistor control circuit has:
a first error operation preventative transistor whose drain is connected to the gate of the output transistor, and whose gate is connected to the source of the output transistor of the two stages forward, and
a second error operation preventative transistor whose drain is connected to the source of the output transistor, and whose gate is connected to the source of the output transistor of two stages forward.

10. The signal transmission circuit according to claim 9, wherein the circuit of each stage includes a third error operation preventative transistor whose drain is connected to the source of the output transistor, and whose gate is connected to the source of the output transistor of the two stages backward.

11. The signal transmission circuit according to claim 9, wherein the circuit of each stage includes:
a charging capacitor;
a second charging transistor (i) to whose gate the pulse voltage is applied, said pulse voltage being sequentially outputted from the corresponding output transistor, (ii) whose drain is connected to the power source line, and (iii) whose source is connected to the plus terminal of the charging capacitor;
a third discharging transistor (i) to whose gate the pulse voltage is applied, said pulse voltage being of the two stages backward from the corresponding output transistor, and (ii) whose drain is connected to the plus terminal of the charging capacitor; and
a fourth error operation preventative transistor (i) whose drain is connected to the gate of the output transistor which is four stages backward from the corresponding output transistor, and (ii) whose gate is connected to the plus terminal of the charging capacitor.

12. The signal transmission circuit according to claim 11, wherein all the transistors are NMOS, and the source of the third discharging transistor is provided with the voltage lower than the threshold voltage of the fourth error operation preventative transistor.

13. The signal transmission circuit according to claim 9, wherein said all transistor are NMOS, and each source of the first to third discharging transistors is connected to the earth voltage.

14. The signal transmission circuit according to claim 9, wherein all the transistors are NMOS, and the source of the first error operation preventative transistor is connected to the earth voltage.

15. The signal transmission circuit according to claim 9, wherein said all transistor are NMOS, and each source of the first error operation preventative transistor and the first discharging transistor is provided with the voltage lower than the threshold voltage of the output transistor.

16. The signal transmission circuit according to claim 1, wherein as for the first discharging transistor, the pulse voltage is applied to the gate, said pulse voltage being provided from the source of the output transistor of the next stage;
as for the second discharging transistor, the pulse voltage is applied to the gate, said pulse voltage being provided from the source of the output transistor of the next stage; and
the output transistor control circuit is a logical circuit which (i) outputs the voltage signal of "High" level in the case the source voltage of the output transistor is "High" level, and (ii) outputs the voltage signal of "Low" level, according to the gate voltage of the output transistor, in the case the source voltage of the output transistor is "Low" level.

17. The signal transmission circuit according to claim 16, wherein the logical circuit has:
a first transistor (i) whose drain is connected to the power source; and (ii) whose gate is connected to the source of the output transistor;
an inverter which receives the gate of the output transistor as the input;
a second transistor whose gate is connected to the output terminal of the inverter;
a third transistor (i) whose drain is connected to the source of the output transistor of the circuit of each stage, (ii) whose gate is connected to the source of the second transistor, and (iii) whose source is connected to the earth line;
a fourth transistor (i) whose gate is connected to the gate of the output transistor of the circuit of each stage, and (ii) whose drain is connected to the gate of the third transistor; and
the source of the first transistor is connected to the drain of the second transistor.

18. The signal transmission circuit according to claim 17, wherein the inverter has:
a fifth transistor whose gate and drain are connected to the power source;
a sixth transistor (i) whose drain is connected to the power source, and (ii) whose gate is connected to the source of the fifth transistor;
a second bootstrap capacitor whose ends are respectively connected to the gate and source of the sixth transistor;
a seventh transistor (i) whose drain is connected to the source of the fifth transistor, and (ii) whose gate is connected to the gate of the output transistor of the circuit of each stage; and
the node is connected to the gate of the second transistor, said node being the source of the sixth transistor and the drain of the seventh transistor, and said source and drain being connected to each other.

19. The signal transmission circuit according to claim 18, wherein the threshold voltage of the seventh transistor is equal to or higher than the threshold voltage of the first transistor.

20. The signal transmission circuit according to claim 18, wherein (i) the channel length of the seventh transistor is shorter than the channel length of the first transistor, and (ii) the resistance value of the first transistor is lower than the resistance value of the seventh transistor in operation.

21. The signal transmission circuit according to claim 18, wherein the power source is commonly connected to said all signal transmission circuits, said power source being connected to (i) the drain of the first transistor, (ii) the drain and the gate of the fifth transistor, and (iii) the drain of the sixth transistor.

22. The signal transmission circuit according to claim 18, wherein the node is commonly connected to said all signal transmission circuits, said node being connected to the source of the first transistor and the drain of the second transistor.

23. The signal transmission circuit according to claim 16, wherein all the transistors are NMOS, and each source of the first to third discharging transistor is connected to the earth voltage.

24. The signal transmission circuit according to claim 16, wherein all the transistors are NMOS, and the source of the first error operation preventative transistor is connected to the earth voltage.

25. The signal transmission circuit according to claim 16, wherein said all transistors are NMOS, and each source of the first error operation preventative transistor and the first discharging transistor is provided with the voltage lower than the threshold voltage of the output transistor.

26. A solid image sensor utilizing a signal transmission circuit,
wherein the signal transmission circuit includes plural stages of circuit in each of which the pulse voltage according to the driving pulse is sequentially outputted, the circuit of each stage including:
an output transistor outputting the pulse voltage, according to the driving pulse, to the source;
a bootstrap capacitor connected between the gate and the source of the output transistor;
a first charging transistor whose drain is connected to a power source or an earth line and whose source is connected to the gate of the output transistor in order to charge the bootstrap capacitor,
wherein in the case of the first stage, a start pulse is provided to the gate, and in the case of the second stage or backward, the gate is connected to the gate of the output transistor;
a first discharging transistor whose drain is connected to an end of the bootstrap capacitor;
a second discharging transistor whose drain is connected to the other end of the bootstrap capacitor; and
an output transistor control circuit which prevents the pulse voltage from being outputted from the output transistor of each circuit of the other stages, in the case the pulse voltage is outputted from the source of the output transistor.

27. An Liquid Crystal Display (LCD) apparatus utilizing a signal transmission circuit,
wherein a signal transmission circuit includes plural stages of circuit in each of which the pulse voltage, according to the driving pulse, is sequentially outputted, the circuit of each stage including:
an output transistor outputting the pulse voltage, according to the driving pulse, to the source;
a bootstrap capacitor connected between the gate and the source of the output transistor;
a first charging transistor whose drain is connected to a power source or an earth line and whose source is connected to the gate of the output transistor in order to charge the bootstrap capacitor,
wherein in the case of the first stage, a start pulse is provided to the gate, and in the case of the second stage or backward, the gate is connected to the gate of the output transistor;
a first discharging transistor whose drain is connected to an end of the bootstrap capacitor;
a second discharging transistor whose drain is connected to the other end of the bootstrap capacitor; and
an output transistor control circuit which prevents the pulse voltage from being outputted from the output transistor of each circuit of the other stages, in the case the pulse voltage is outputted from the source of the output transistor.

* * * * *